US009893610B2

(12) United States Patent
Nakashima et al.

(10) Patent No.: US 9,893,610 B2
(45) Date of Patent: Feb. 13, 2018

(54) POWER UNIT AND POWER CONVERSION APPARATUS

(71) Applicant: MITSUBISHI ELECTRIC CORPORATION, Chiyoda-ku, Tokyo (JP)

(72) Inventors: Yukio Nakashima, Tokyo (JP); Takayoshi Miki, Tokyo (JP); Hisanori Yamasaki, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 114 days.

(21) Appl. No.: 15/029,901

(22) PCT Filed: Oct. 17, 2013

(86) PCT No.: PCT/JP2013/006172
§ 371 (c)(1),
(2) Date: Apr. 15, 2016

(87) PCT Pub. No.: WO2015/056286
PCT Pub. Date: Apr. 23, 2015

(65) Prior Publication Data
US 2016/0241136 A1    Aug. 18, 2016

(51) Int. Cl.
*H02M 1/44* (2007.01)
*H02M 7/00* (2006.01)
(Continued)

(52) U.S. Cl.
CPC ............. *H02M 1/44* (2013.01); *H02M 7/003* (2013.01); *H02M 7/42* (2013.01); *H05K 7/209* (2013.01); *H01F 2017/065* (2013.01)

(58) Field of Classification Search
CPC .......... H02M 1/44; H02M 7/003; H02M 7/42; H05K 7/209; H01F 2017/065
See application file for complete search history.

(56) References Cited

U.S. PATENT DOCUMENTS 6,346,673 B1    2/2002  Onizuka
7,760,503 B2 *  7/2010  Aoki ............... H01L 23/473
                                          165/104.33
(Continued)

FOREIGN PATENT DOCUMENTS

CN    101534069 A    9/2009
JP     58-80787 U    6/1983
(Continued)

OTHER PUBLICATIONS

International Search Report (PCT/ISA/210) dated Jan. 21, 2014, by the Japanese Patent Office as the International Searching Authority for International Application No. PCT/JP2013/006172.
(Continued)

*Primary Examiner* — Jue Zhang
(74) *Attorney, Agent, or Firm* — Buchanan Ingersoll & Rooney PC

(57) ABSTRACT

To reduce radiation noise generated when a semiconductor device in a power unit performs switching, a core is provided outside the power unit. The closer the core is disposed to the semiconductor device that is generating the radiation noise, the greater the effect of reducing the radiation noise is obtained. However, since there has been no space to provide the core inside the power unit, there has been a limitation in the reduction of radiation noise. The invention provides a power unit including a core in the interior thereof. In order to install a first core inside the power unit, a first output-side conductor bar, a second output-side conductor bar, and a third output-side conductor bar are connected to an output of an inverter include a first bundle portion. The first bundle portion passes through a first penetrating opening of the first core provided inside the power unit.

16 Claims, 18 Drawing Sheets

(51) Int. Cl.
*H02M 7/42* (2006.01)
*H05K 7/20* (2006.01)
*H01F 17/06* (2006.01)

(56) References Cited

U.S. PATENT DOCUMENTS

| | | | |
|---|---|---|---|
| 7,978,471 B2 | 7/2011 | Tokuyama et al. | |
| 2002/0089056 A1* | 7/2002 | Eady | H05K 7/1424 |
| | | | 257/712 |
| 2007/0279864 A1* | 12/2007 | Hirota | H02M 1/36 |
| | | | 361/697 |
| 2010/0277871 A1* | 11/2010 | Kitanaka | B60L 9/16 |
| | | | 361/710 |
| 2011/0194253 A1* | 8/2011 | Momose | H01L 23/467 |
| | | | 361/697 |

FOREIGN PATENT DOCUMENTS

| | | |
|---|---|---|
| JP | 02-146901 U | 12/1990 |
| JP | 05-136592 A | 6/1993 |
| JP | 07-226639 A | 8/1995 |
| JP | 2000-173828 A | 6/2000 |
| JP | 2004-187368 A | 7/2004 |
| JP | 2008-054396 A | 3/2008 |
| JP | 2008-125248 A | 5/2008 |
| JP | 2009-219270 A | 9/2009 |

OTHER PUBLICATIONS

Chinese First Office Action dated Aug. 30, 2017 issued in the corresponding Chinese Patent Application No. 291380080235X and partial English translation (6 pages).

\* cited by examiner

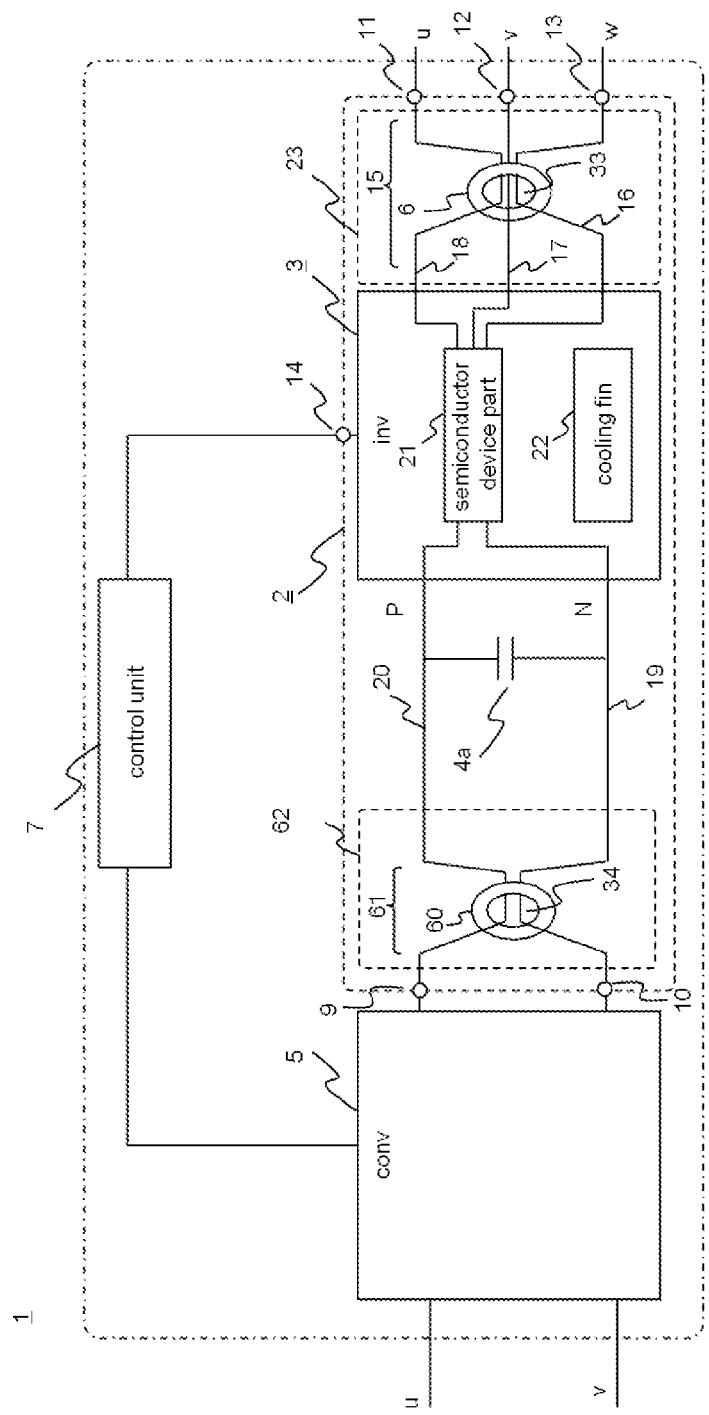

POWER UNIT AND POWER CONVERSION APPARATUS

TECHNICAL FIELD

The invention relates to noise reduction in a power unit and a power conversion apparatus.

BACKGROUND ART

In a conventional power conversion apparatus that receives power from a DC power source system and supplies power to a load, radiation noise is generated by switching operation of semiconductor devices that constitute an inverter included in the power conversion apparatus, and thereby inductive interference and influence on a radio frequency band have been problems.

In order to overcome the problems described above, a power conversion apparatus including a core having a penetrating opening through which a high-voltage line connecting a DC power source to an inverter and a ground line grounding an inverter pass has been proposed (for example, refer to Patent Document 1).

In the conventional power conversion apparatus, a core is provided between a housing of the power conversion apparatus and a power unit that includes an inverter, a cooling fin for cooling the inverter, and a capacitor connected in parallel to the inverter. In general, radiation noise reduction effect can be more enhanced as an installation position of the core is closer to the inverter that generates the radiation noise.

PRIOR ART DOCUMENT

Patent Document

Patent Document 1: Japanese Unexamined Patent Publication No. 2008-54396 (pages 3 and 4, FIG. 1)

SUMMARY OF THE INVENTION

Problems to be Solved by the Invention

However, in the conventional power conversion apparatus, there is no space inside the power unit to install the core, and thus the core is installed outside the power unit, thereby limiting radiation noise reduction.

The present invention has been made to overcome the above-described problems, and by installing the core inside the power unit, radiation noise can be further reduced than ever before.

Means for Solving the Problems

A power unit that can be attached to and detached from a power conversion apparatus includes: a semiconductor device part that is provided with a first input terminal, a second input terminal, a first output terminal, a second output terminal, and a third output terminal, and that converts electric power inputted to the first input terminal and the second input terminal to output the converted electric power to the first output terminal, the second output terminal, and the third output terminal; a capacitor that is connected in parallel to the semiconductor device part via the first input terminal and the second input terminal; a first output-side conductor bar, a second output-side conductor bar, and a third output-side conductor bar that are respectively connected to the first output terminal, the second output terminal, and the third output terminal, and included inside the power unit; and a first core through which the first output-side conductor bar, the second output-side conductor bar, and the third output-side conductor bar pass, and that is included inside the power unit, wherein when the power unit is viewed from a side of a cooling fin that is disposed in a side of the semiconductor device part different from a side in which the capacitor is disposed, and that dissipates heat generated from the semiconductor device part, the semiconductor device part, the capacitor, the first output-side conductor bar, the second output-side conductor bar, the third output-side conductor bar, and the first core are placed only inside an area occupied by the cooling fin.

In addition, the power conversion apparatus according to the present invention includes the above-described power unit and a control unit controlling the semiconductor device part included in the power unit.

Effect of the Invention

The power unit according to the present invention can reduce radiation noise more than ever before.

Further, the power conversion apparatus according to the present invention can reduce radiation noise more than ever before.

BRIEF DESCRIPTION OF THE DRAWINGS

FIG. 9 is a diagram schematically illustrating a power unit and a power conversion apparatus including the power unit according to Embodiment 3 of the present invention.

EMBODIMENT FOR CARRYING OUT THE INVENTION

Embodiment 1

Figure 1:
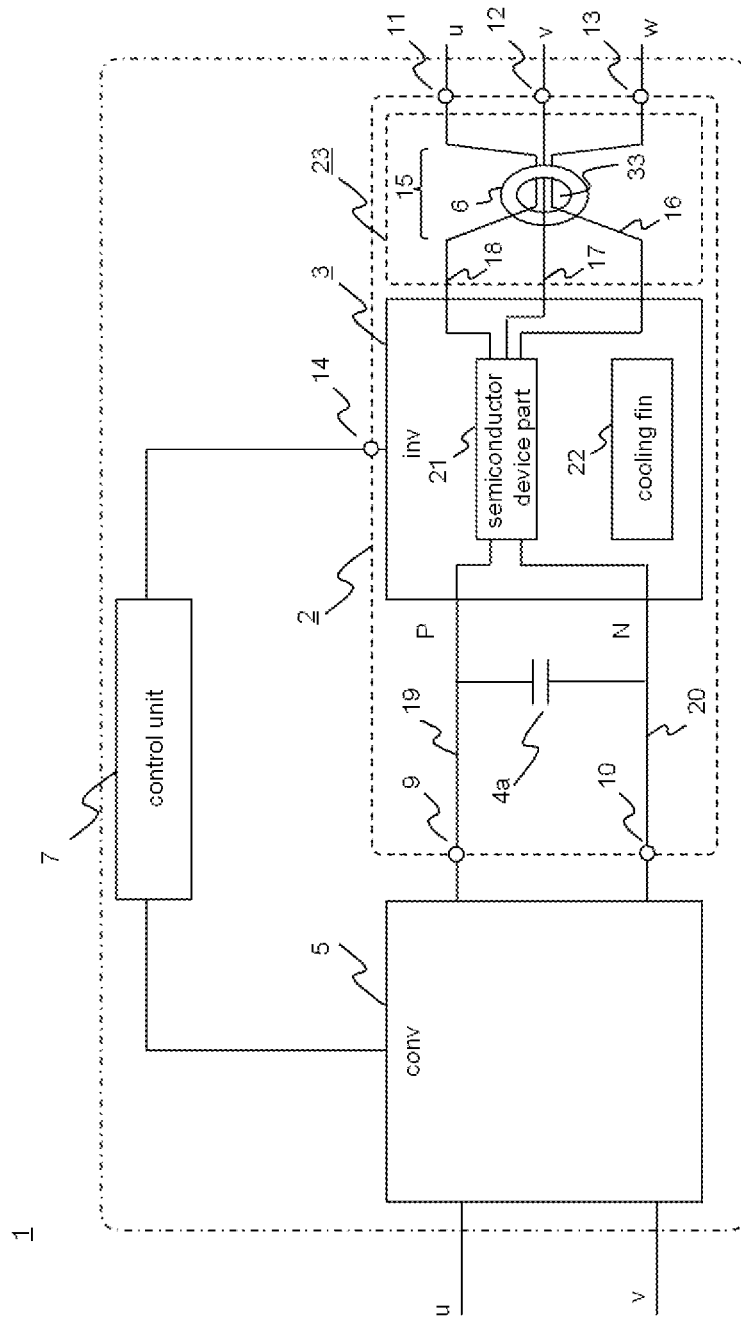
FIG. 1 is a diagram schematically illustrating a power unit and a power conversion apparatus including the power unit according to Embodiment 1 of the present invention.

FIG. 1 is a diagram schematically illustrating a power unit and a power conversion apparatus including the power unit according to Embodiment 1 of the present invention. A shown in FIG. 1, a power conversion apparatus 1 according to Embodiment 1 of the present invention includes a power unit 2, a converter 5 that supplies electric power to the power unit 2, and a control unit 7 that controls the power unit 2 and the converter 5.

The power unit 2 can be attached to and detached from the power conversion apparatus 1. When installed inside the power conversion apparatus 1, the power unit 2 is connected to components of the power conversion apparatus 1 via terminals 9, 10, 11, 12, 13, and 14.

The power unit 2 includes the inverter 3, a first input-side conductor bar 19 and a second input-side conductor bar 20 that are provided on the input side of inverter 3, a capacitor 4a that is electrically connected in parallel to the inverter 3 on the input side thereof, and an output-side conductor unit 23 that is provided on the output side of the inverter 3.

The power unit 2 includes a semiconductor device part 21 that converts, by switching operation, DC power inputted to the power unit 2 into AC power of a desired frequency and voltage, and a cooling fin 22 for dissipating heat generated at the semiconductor device part 21. The first input-side conductor bar 19 and the second input-side conductor bar 20 are connected on the input side of semiconductor device part 21.

The output-side conductor unit 23 includes a first output-side conductor bar 16, a second output-side conductor bar 17, a third output-side conductor bar 18, and a first core 6. Further, in the output-side conductor unit 23, a first bundle portion 15 in which the first output-side conductor bar 16, the second output-side conductor bar 17, and the third output-side conductor bar 18 are combined passes through a first penetrating opening 33 of the first core 6.

As shown in FIG. 1, the first output-side conductor bar 16, the second output-side conductor bar 17, and the third output-side conductor bar 18 each are connected on the output side of semiconductor device part 21.

As shown in FIG. 1, the AC power inputted to the power conversion apparatus 1 via "u" line and "v" line is converted by the converter 5 into the DC power that is inputted via the first input-side conductor bar 19 and the second input-side conductor bar 20 to the inverter 3 included in the power unit 2, and the DC power is converted by the semiconductor device part 21 into the AC power of a desired frequency and voltage.

The converted AC power is outputted by way of the first output-side conductor bar 16, the second output-side conductor bar 17, and the third output-side conductor bar 18 to "u" line, "v" line, and "w" line via the terminals 11, 12, and 13. The outputted AC power drives an electric motor (not shown) that is connected on the output side of power conversion apparatus 1. The power unit 2 can be replaced in accordance with the specifications of electric motor. In addition, for the maintenance of power unit 2 (cleaning etc. of cooling fin 22), the power unit 2 is attachable or detachable.

Figure 2A:
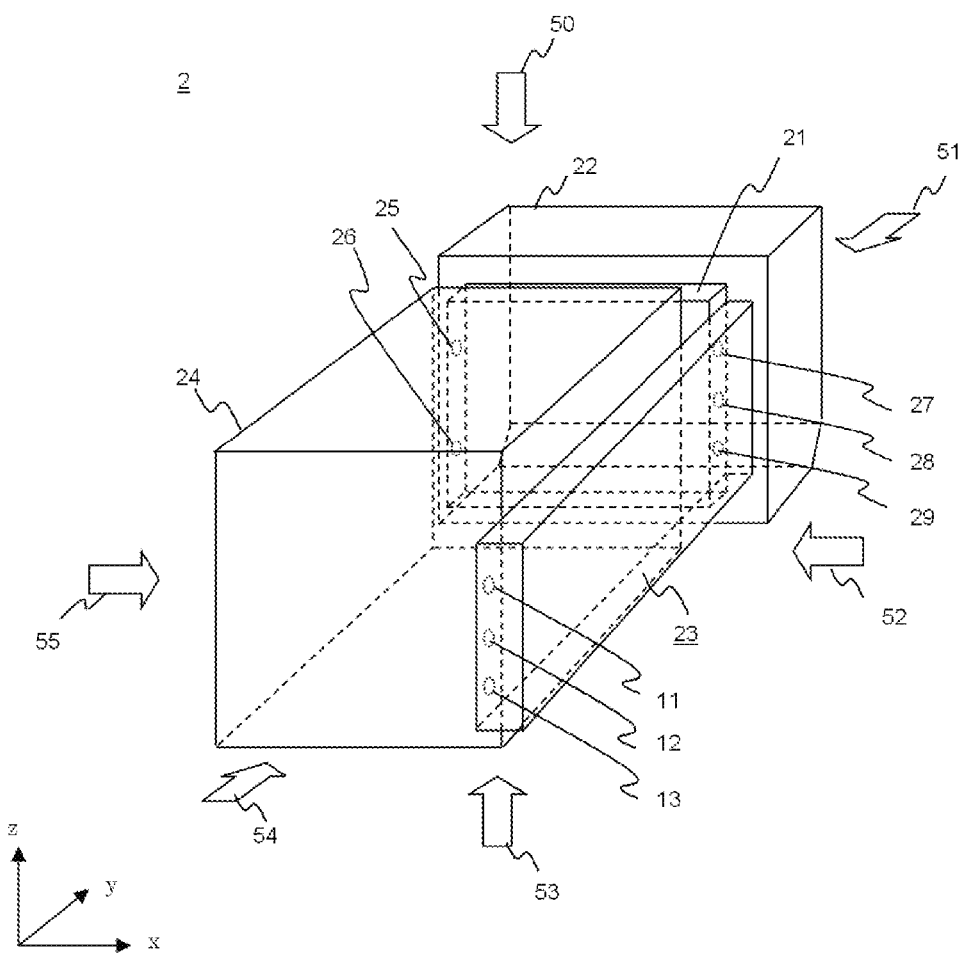
FIG. 2A shows a three-dimensional configuration of the power unit according to Embodiment 1 of the present invention.

FIG. 2A is a diagram schematically illustrating a three-dimensional configuration of the power unit 2 according to Embodiment 1 of the present invention. As described above, the power unit 2 includes the semiconductor device part 21, the cooling fin 22, a capacitor installation part 24 in which the capacitor 4a is installed, and the output-side conductor unit 23. In FIG. 2, a line parallel to the depthwise direction in a plane included in the horizontal plane is defined as the y-axis, an axis that is in the horizontal plane and orthogonal to the y-axis is defined as the x-axis, and a line parallel to the vertical direction is defined as the z-axis.

In FIG. 2A, an area occupied by the capacitor 4a is indicated as the capacitor installation part 24. In the capacitor installation part 24, a single capacitor 4a may be installed or a capacitor 4a in which a plurality of capacitors 4 are connected in parallel may be installed. The capacitor 4a realized by the plurality of capacitors 4 enables adjustment of electrostatic capacitance of the capacitor 4a.

In FIG. 2A, the capacitor installation part 24 is shown as a rectangular parallelepiped that has a longitudinal depth in the y-axis direction. In the longitudinal direction of capacitor installation part 24, the semiconductor device part 21 is adjacently installed. Further, on a face opposite to the side of semiconductor device part 21 where the capacitor installation part 24 is installed, the cooling fin 22 is adjacently disposed.

A first input terminal 25 and a second input terminal 26 are provided at a face in which the semiconductor device part 21 is not in contact with the capacitor installation part 24 and the cooling fin 22. Further, at the opposite face to the face in which the first input terminal 25 and the second input terminal 26 are provided, a first output terminal 27, a second output terminal 28, and a third output terminal 29 are provided.

The cooling fin 22, for example, includes a large number of plate-like structural elements (not shown) inside thereof, and external air flowing in and out of ventilation holes etc. (not shown) provided in the housing of cooling fin 22 goes through the inside of cooling fin 22, so that heat generated from the semiconductor device part 21 is effectively dissipated.

Figure 2B:
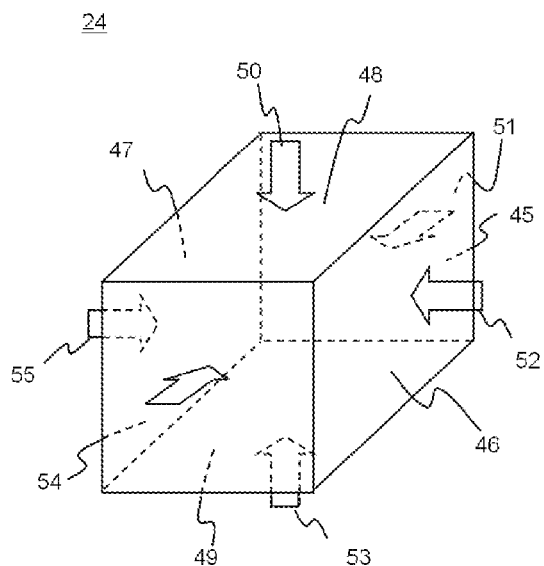
FIG. 2B shows a diagram to explain faces surrounding the capacitor installation part according to Embodiment 1 of the present invention.

To simplify the explanation of FIG. 2, definitions of six faces surrounding the capacitor installation part 24 are made. FIG. 2B is a diagram to explain faces surrounding the capacitor installation part 24. In FIG. 2B, a face at which the capacitor installation part 24 is in contact with the semiconductor device part 21 is defined as a first face 45.

Further, faces adjacent to the first face 45 and vertical to the horizontal plane are defined as a second face 46 and a third face 47. Furthermore, faces adjacent to the first face 45 and parallel to the horizontal face are defined as an upper face 48 and a lower face 49.

As described above, the output-side conductor unit 23 includes the first output-side conductor bar 16, the second output-side conductor bar 17, the third output-side conductor bar 18, and the first core 6. In FIG. 2A, for a clarification of the installation position of output-side conductor unit 23, the output-side conductor unit 23 is simply shown as a three-dimensional plate whose longitudinal direction is parallel to the y-axis direction. A detailed configuration of the output-side conductor unit 23 will be given later on.

As shown in FIG. 2A, the output-side conductor unit 23 is provided so as to be in contact with the second face 46 of capacitor installation part 24 and the semiconductor device part 21. An end portion of the output-side conductor unit 23 in the longitudinal direction is connected to the first output terminal 27, the second output terminal 28, and the third output terminal 29 that are provided in the semiconductor device part 21.

Within the end portions of output-side conductor unit 23 in the longitudinal direction, the terminals 11, 12, and 13 are provided at the end portion opposite to the end portion that is connected to the semiconductor device part 21. When the power unit 2 is installed inside the power conversion apparatus 1, the power unit 2 is connected to the power conversion apparatus 1 via the terminals 11, 12, and 13.

Here, an explanation will be given on an area where the capacitor installation part 24, the semiconductor device part 21, the cooling fin 22, the output-side conductor unit 23, and the cooling fin 22 are installed. As shown in FIG. 2A, when the power unit 2 is installed inside the power conversion apparatus 1, an area where the power unit 2 occupies is defined as a housing area. That is, the power unit 2 including the capacitor installation part 24, the semiconductor device part 21, the cooling fin 22, and the output-side conductor unit 23 fits into the housing area.

The capacitor installation part 24, the semiconductor device part 21, the cooling fin 22, and the output-side conductor unit 23 fit into the housing area, so that the power unit 2 can be easily attached inside the power conversion apparatus 1. Similarly, it can be easily detached. There is no protrusion in the faces parallel to the y-axis in the power unit 2 shown in FIG. 2, and thus, when attached and detached, the power unit 2 can be smoothly moved particularly in the y-axis direction.

Note that, in a case where the movement direction of power unit 2 upon the attachment or the detachment of power unit 2 differs from the y-direction shown in FIG. 2, installation positions of the capacitor installation part 24, the semiconductor device part 21, the cooling fin 22, and the output-side conductor unit 23 can be changed in accordance with a different direction concerned.

Further, as shown in FIG. 2, an arrow 50 is defined to indicate a direction to which the power unit 2 and the capacitor installation part 24 are viewed downwardly from above. An arrow 53 indicates a direction to which the power unit 2 and the capacitor installation part 24 are viewed upwardly from below. In addition, an arrow 52 indicates a direction vertical to the second face 46 from the outer side with respect to the power unit 2 and the capacitor installation part 24.

Furthermore, an arrow 55 indicates a direction vertical to the third face from the outer side with respect to the power unit 2 and the capacitor installation part 24. An arrow 51 indicates a direction vertical to the first face from the outer side with respect to the power unit 2 and the capacitor installation part 24. In addition, an arrow 54 indicates a direction vertical to the opposite face to the first face of capacitor installation part 24, from the outer side with respect to the power unit 2 and the capacitor installation part 24.

The arrows 50 to 55 are used when an explanation of a six-sided view of the power unit 2 according to the present invention is given. A detailed explanation of the power unit 2 will be given later on.

Next, the output-side conductor unit 23 will be described in detail. FIG. 3 shows shapes of the first output-side conductor bar 16, the second output-side conductor bar 17, and the third output-side conductor bar 18 that are included in the output-side conductor unit 23. Particularly in three-sided views, FIG. 3A shows the first output-side conductor bar 16, FIG. 3B shows the second output-side conductor bar 17, and FIG. 3C shows the third output-side conductor bar 18.

Here, the three-sided view in the present specification shows a front view, a plan view, and a side view of the illustrated structure, and the front view is shown in the upper side, the plan view in the lower left side, and the side view in the lower right side. Note that, "front", "plan", and "side" in the terms of the front view, the plan view, and the side view indicate formal directions to show the illustrated structure, and do not relate to the directions in a state of the structure mounted on the power unit 2.

Figure 3A:
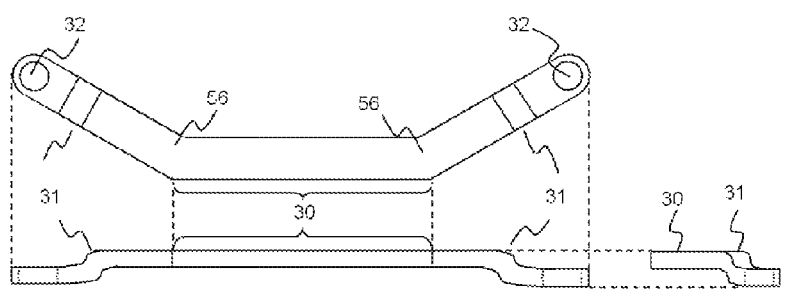
FIG. 3A shows shapes of first output-side conductor bars according to Embodiment 1 of the present invention.
Figure 3B:
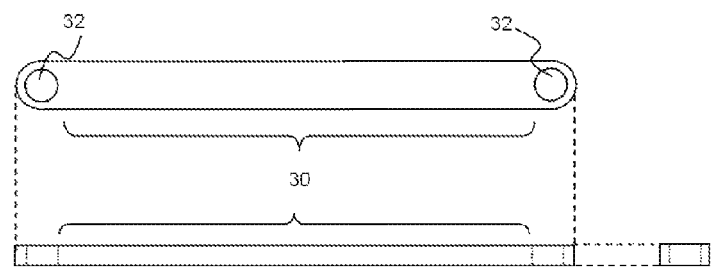
FIG. 3B shows shapes of second output-side conductor bars according to Embodiment 1 of the present invention.
Figure 3C:
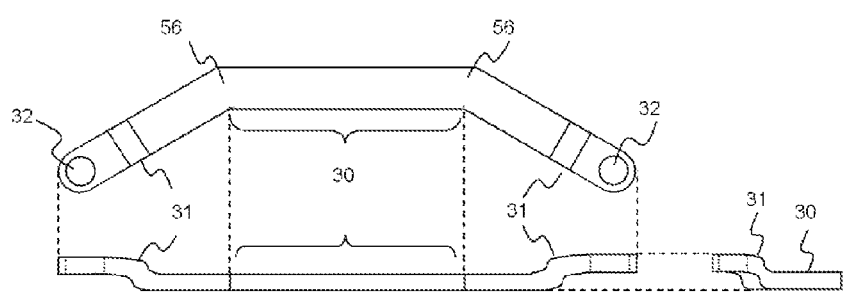
FIG. 3C shows shapes of third output-side conductor bars according to Embodiment 1 of the present invention.

As shown in FIG. 3A, the first output-side conductor bar 16 is a plate conductor having a uniform thickness. Two bent portions 56 are intermediately provided in its extending direction of the first output-side conductor bar 16. At the two bent portions 56, the first output-side conductor bar 16 is bent in a same direction at a preset angle.

Further, the first output-side conductor bar 16 has terminal connection holes 32 at both end portions, and using screws or the like penetrating the output-side conductor unit 23, one of the end portions is connected to the first output terminal 27 provided in the semiconductor device part 21 described above.

Further, between the two bent portions 56 in the first output-side conductor bar 16, an extended portion 30 being linear is provided. Step portions 31 are provided between the bent portion 56 and the terminal connection hole 32, and at the step portion 31 as a boundary, the position of a plane including the extended portion 30 differs from the position of a plane including both the end portions of the first output-side conductor bar 16, with respect to the thickness-wise direction of the first output-side conductor bar 16. The lower illustration in FIG. 3A shows that the extended portion 30 is at an upper position than the positions of both end portions of the first output-side conductor bar 16.

As shown in FIG. 3B, the second output-side conductor bar 17 is a plate conductor having a uniform thickness. The second output-side conductor bar 17 is linear without having the bent portions 56 and the step portions 31, being different from the first output-side conductor bar 16 described above.

The second output-side conductor bar 17 has terminal connection holes 32 at both end portions, and using screws or the like penetrating the output-side conductor unit 23, one of the end portions is connected to the second output terminal 28 provided in the semiconductor device part 21 described above. In addition, the linear portion between the two terminal connection holes 32 provided in the both end portions of the second output-side conductor bar 17 corresponds to the extended portion 30.

As shown in FIG. 3C, the third output-side conductor bar 18 is a plate conductor having a uniform thickness. Regarding the third output-side conductor bar 18, at the step portion 31 as a boundary, the position of a plane including the extended portion 30 differs from the position of a plane including the both end portions of the third output-side conductor bar 18, with respect to the thicknesswise direction of the third output-side conductor bar 18. Thus, the positional relation is inverted compared to that of the first output-side conductor unit 16 shown in FIG. 3A. That is, the lower illustration in FIG. 3C shows that the extended portion 30 is at a lower position than the positions of both end portions of the third output-side conductor bar 18.

Other than the difference described, the third output-side conductor bar 18 has the same shape as the first output-side conductor bar 16 shown in FIG. 3A. The third output-side conductor bar 18 has terminal connection holes 32 provided at both end portions, and using screws or the like penetrating the output-side conductor unit 23, one of the end portions is connected to the second output terminal 29 provided in the semiconductor device part 21 described above.

Figure 4:
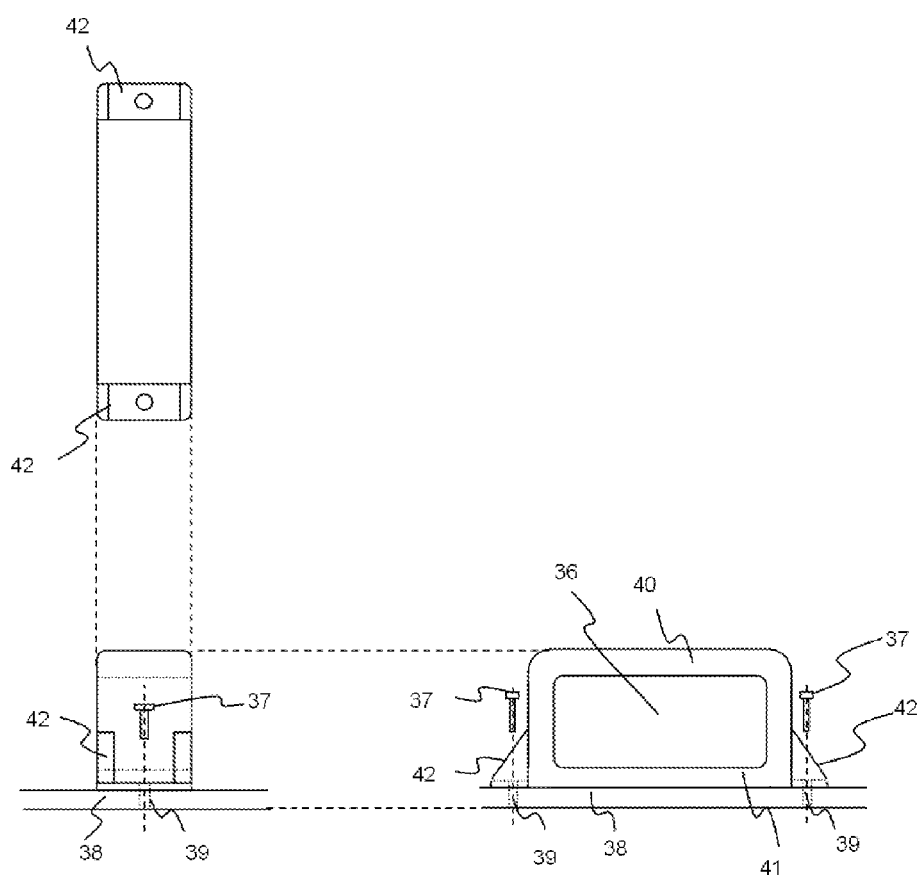
FIG. 4 shows a shape of a split core according to Embodiment 1 of the present invention.

Next, the first core 6 included in the output-side conductor unit 23 will be described. The first core 6 includes a plurality of split cores 35. FIG. 4 is a three-sided view of the split core 35 according to Embodiment 1 of the present invention. As shown in FIG. 4, the split core 35 has ring structure with a penetrating opening 36. Core fixing protrusion portions 42 are provided on the outer peripheral sides of split core 35, and thus the split core 35 is fixed on a fixing plate 38 via the core fixing protrusion portions 42.

Screw holes 39 are provided in the core fixing protrusion portions 42, and the split core 35 is fixed to the fixing plate 38 by fixing screws 37 inserted into the screw holes 39. In the split core 35, the portion in contact with the fixing plate 38 is defined as a fixing portion 41 of the split core 35. Further, the portion that is not in contact with the fixing plate 38 is defined as an arch portion 40 of the split core 35. That is, the core fixing protrusion portions 42 are provided on the side of fixing portion 41.

Although the penetrating opening 36 is rectangular in shape in the split core 35 shown in FIG. 4 (rectangular split core), a split core 35 having a shape in the penetrating opening 36 other than the rectangular shape may be used in accordance with the space inside the power unit 2.

For example, it is possible to use a split core 35 in which the penetrating opening 36 is substantially circular in shape (circular split core). Note that, using the split core 35 having the rectangular shape in the penetrating opening 36, the space inside the power unit 2 can be effectively used. However, when the circular split core is used, a dead space becomes larger than in the case when the rectangular split core is used.

Note that, as material for the split core 35, amorphous, ferrite, or the like can be used. In addition, although a case where the first core 6 is constituted by the plurality of split cores is described here, the first core 6 may be constituted by one member.

In the power unit 2 according to Embodiment 1 of the present invention, the penetrating opening 36 in the plurality of split cores 35 is rectangular in shape, so that the space inside the power unit 2 can be effectively used, thereby enabling downsizing the power unit 2.

Figure 5A:
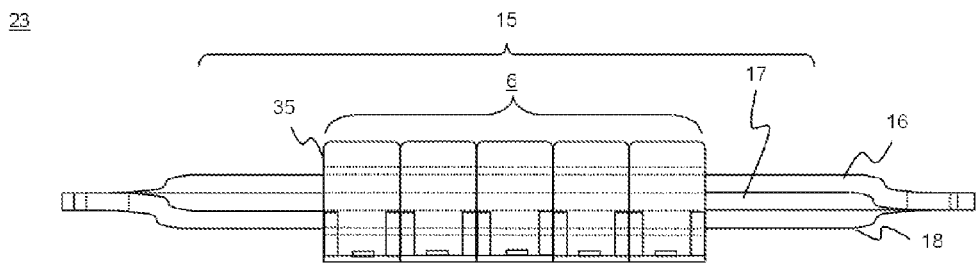
FIG. 5A shows front view installation positions of the first to the third output-side conductor bars and split cores in an output-side conductor unit according to Embodiment 1 of the present invention.

Next, an explanation will be given on the output-side conductor unit 23 including the first output-side conductor bar 16, the second output-side conductor bar 17, and the third output-side conductor bar 18 that are shown in FIG. 3, and the split core shown in FIG. 4. Using a three-sided view, FIG. 5 shows placement of the first output-side conductor bar 16, the second output-side conductor bar 17, the third output-side conductor bar 18, and the plurality of split cores 35 in the output-side conductor unit 23. Note that, FIG. 5A shows a front view, FIG. 5B shows a plan view, and FIG. 5C shows a side view.

Next, in FIG. 5, it is assumed that respective surfaces except for the terminal connection holes 32 of the first output-side conductor bar 16, the second output-side conductor bar 17, and the third output-side conductor bar 18 (hereinafter, if necessary, the first output-side conductor bar 16, the second output-side conductor bar 17, and the third output-side conductor bar 18 are collectively called the output-side conductor bars) are covered with insulation film (not shown) in order to ensure insulation properties of the output-side conductor bars with each other.

Figure 5B:
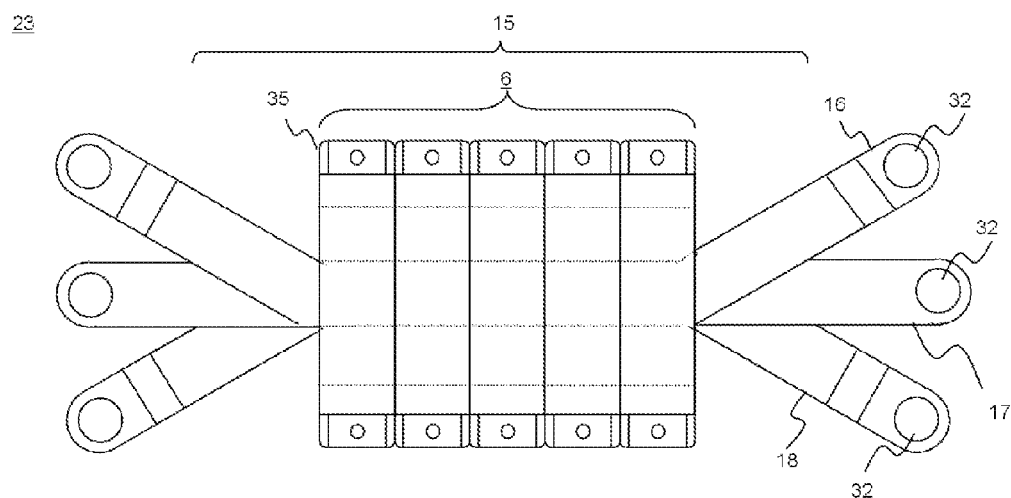
FIG. 5B shows plan view installation positions of the first to the third output-side conductor bars and split cores in an output-side conductor unit according to Embodiment 1 of the present invention.

As shown in FIG. 5B, mutual distance among the first output-side conductor bar 16, the second output-side conductor bar 17, and the third output-side conductor bar 18 becomes smaller from the terminal connection holes 32 provided at each end portion toward the center of extended portion 30. A portion in contact with the first output-side conductor bar 16, the second output-side conductor bar 17, and the third output-side conductor bar 18 except for the terminal connection holes 32 is defined as the first bundle portion 15.

Figure 5C:
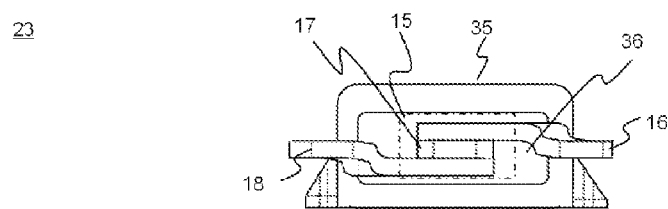
FIG. 5C shows side view installation positions of the first to the third output-side conductor bars and split cores in an output-side conductor unit according to Embodiment 1 of the present invention.

As shown in FIG. 5B and FIG. 5C, the first output-side conductor bar 16, the second output-side conductor bar 17, and the third output-side conductor bar 18 are stacked and disposed so as to be in contact with respective extended portions 30. In addition, the second output-side conductor bar 17 is placed between the first output-side conductor bar 16 and the third output-side conductor bar 18.

As shown in FIG. 5A and FIG. 5C, the terminal connection holes 32 in the output-side conductor bars disposed in a stack are all positioned at the same plane owing to the step portions 31. Positioning the terminal connection holes 32 at the same plane enables structure for connecting the output-side conductor bars to be simple. Note that, it is natural that, in a case without the step portions 31, a terminal block and connection bars that are connected to the output-side conductor bars may be provided with step portions for the connection.

The first bundle portion 15 passes through the penetrating opening 36 of the split core 35. The plurality of split cores 35 that are disposed side by side in the extending direction of output-side conductor bars constitute the first core 6. That is, the first penetrating opening 33 of first core 6 that can be formed by disposing the split cores 35 side by side is rectangular in shape. The first core 6 includes the split cores 35, and thereby the length of first core 6, that is, the length of extended portion 30 of the output-side conductor bar is properly adjustable in the extending direction.

In the power unit 2 according to Embodiment 1 of the present invention, the first core 6 is formed by disposing the plurality of split cores 35 including the penetrating opening 36, side by side in the extending direction of the first output-side conductor bar 16, the second output-side conductor bar 17, and the third output-side conductor bar 18, so that the length of first core 6 in the extending direction with respect to the output-side conductor bars is adjustable by changing the number of the split cores 35.

In FIG. 6, the power unit 2 is shown in which, in terms of the output-side conductor unit 23 shown in FIG. 2, the configuration of the first output-side conductor bar 16, the second output-side conductor bar 17, the third output-side conductor bar 18, the first core 6, and the capacitor installation part 24 are made clear. Note that, FIG. 6A to FIG. 6F are figures viewed from the directions of arrow 50 to arrow 55 shown in FIG. 2.

Figure 6A:
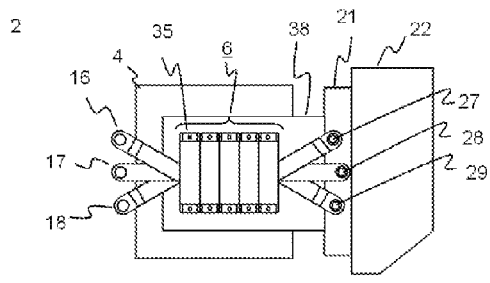
FIG. 6A is a six-sided view showing the detail of power unit according to Embodiment 1 of the present invention.
Figure 6D:
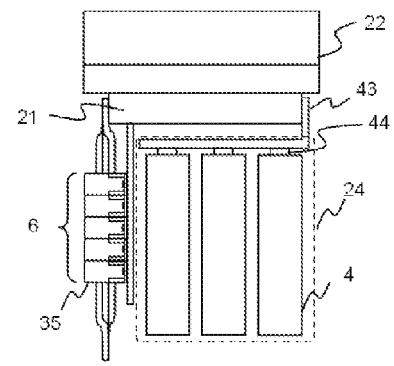
FIG. 6D is a six-sided view showing the detail of power unit according to Embodiment 1 of the present invention.
Figure 6B:
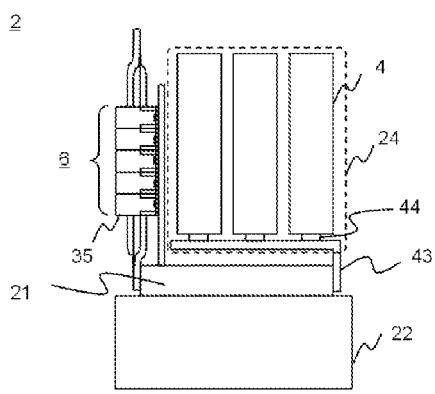
FIG. 6B is a six-sided view showing the detail of power unit according to Embodiment 1 of the present invention.
Figure 6E:
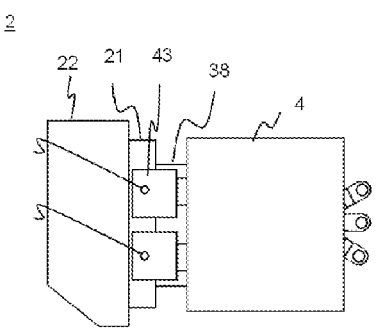
FIG. 6E is a six-sided view showing the detail of power unit according 5 to Embodiment 1 of the present invention.
Figure 6C:
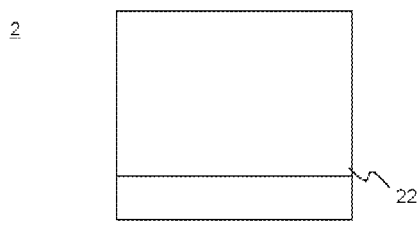
FIG. 6C is a six-sided view showing the detail of power unit according to Embodiment 1 of the present invention.
Figure 6F:
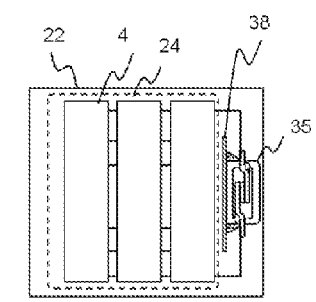
FIG. 6F is a six-sided view showing the detail of power unit according to Embodiment 1 of the present invention.

That is, FIG. 6A is a diagram showing the power unit 2 viewed from the direction of arrow 52 shown in FIG. 2. FIG. 6B is a diagram showing the power unit 2 viewed from the direction of arrow 50 shown in FIG. 2. FIG. 6C is a diagram showing the power unit 2 viewed from the direction of arrow 51 shown in FIG. 2. FIG. 6D is a diagram showing the power unit 2 viewed from the direction of arrow 53 shown in FIG. 2. FIG. 6E is a diagram showing the power unit 2 viewed from the direction of arrow 55 shown in FIG. 2. FIG. 6F is a diagram showing the power unit 2 viewed from the direction of arrow 54 shown in FIG. 2.

As shown in FIG. 6A to FIG. 6E, three of the capacitor 4 electrically connected in parallel are installed in the capacitor installation part 24. A capacitor connection terminal 44 is provided in each capacitor 4, and the capacitor connection terminals 44 are electrically connected, via capacitor connection conductors 43, to the first input terminal 25 and the second input terminal 26 that are provided in the semiconductor device part 21.

Although two capacitor connection conductors 43 have L-shaped plate structure as shown in FIG. 6E, they are not limited to the structure. As the capacitor connection conductors 43, any structure may be employed as long as the capacitor connection terminals 44 for the capacitor 4 can be electrically connected to the first input terminal 25 and the second input terminal 26. For example, a cable coated with an insulator or the like may be used.

As shown in FIG. 6, the fixing plate 38 having flat-plate structure is provided between the first core 6 and the second face 46 of capacitor installation part 24. The fixing plate 38 is provided so as for the one side thereof to be fixed to the semiconductor device part 21, and the plurality of cores 35 are fixed on the fixing plate 38.

Since the fixing plate 38 is fixed perpendicular to the semiconductor device part 21, even when a load downward in the vertical direction caused by the weight of first core 6 is applied to the fixing plate 38, the fixing plate 38 can be stably fixed to the semiconductor device part 21, and thus the output-side conductor unit 23 can be stably held inside the power unit 2.

Note that, the fixing plate 38 is assumed to be a plate in FIG. 6. However, it is not limited to the plate and may have any structure as long as the split core 35 can be fixed. For example, a method may be employed in which a bar plate is provided at positions corresponding to the core fixing protrusion portions 42 and a part of the bar plate is fixed to the semiconductor device part 21, the cooling fin 22, or the capacitor 4. By properly changing the structure of fixing plate 38, weight reduction in the power unit 2 can be realized. An explanation on the method to fix the split core 35 on the fixing plate 38 will be omitted, since it has already been given in the explanation of FIG. 4.

As shown in FIG. 6A, the end portions of the first output-side conductor bar 16, the second output-side conductor bar 17, the third output-side conductor bar 18 are respectively connected at the one side via the terminal connection holes 32, to the first output terminal 27, the second output terminal 28, and the third output terminal 29 that are provided in the semiconductor part 21.

Further, as shown in FIG. 6C, components of the power unit 2 do not protrude outside of an area where the cooling fin 22 occupies (the area where the cooling fin 22 occupies when the power unit 2 is viewed from the direction of arrow 51 in FIG. 2), so that the attachment or the detachment of power unit 2 is smoothly carried out. An explanation on the placement of semiconductor device part 21 and cooling fin 22, etc. that are shown in FIG. 6 will be omitted, since it has already been given in the explanation of FIG. 2.

The power unit 2 according to Embodiment 1 of the present invention that can be attached to and detached from the power conversion apparatus includes: the semiconductor device part 21 that is provided with the first input terminal 25, the second input terminal 26, the first output terminal 27, the second output terminal 28, and the third output terminal 29, and that converts electric power inputted to the first input terminal 25 and the second input terminal 26, and that outputs the converted electric power to the first output terminal 27, the second output terminal 28, and the third output terminal 29; the capacitor 4 that is connected in parallel to the semiconductor device part 21 via the first input terminal 25 and the second input terminal 26; the first output-side conductor bar 16, the second output-side conductor bar 17, and the third output-side conductor bar 18 that are respectively connected to the first output terminal 27, the second output terminal 28, and the third output terminal 29, and that are included in the power unit 2; and the first core 6 that is passed through by the first output-side conductor bar 16, the second output-side conductor bar 17, and the third output-side conductor bar 18, and that is included in the power unit 2.

Therefore, the core can be provided at a position closer to the semiconductor device part more than ever before, so that the radiation noise can be reduced.

Further, the power unit 2 according to Embodiment 1 of the present invention includes the first bundle portion 15 in which the first output-side conductor bar 16, the second output-side conductor bar 17, and the third output-side conductor bar 18 are combined, and the first bundle portion 15 penetrates the first core 6, so that the space inside the power unit 2 can be effectively utilized.

Furthermore, in the power unit 2 according to Embodiment 1 of the present invention, the capacitor installation part 24 in which the capacitors 4 are installed has the first face 45 in contact with the semiconductor device part 21, and has the second face 46 and the third face 47 that are adjacent to the first face 45 and vertical to the horizontal plane. Since the first core 6, the first output-side conductor bar 16, the second output-side conductor bar 17, and the third output-side conductor bar 18 are disposed on the second face 46, the fixing plate 38 can be stably fixed to the semiconductor device part 21 and the output-side conductor unit 23 can be stably held inside the power unit 2.

In addition, the power conversion apparatus 1 according to Embodiment 1 of the present invention includes the power unit 2 according to Embodiment 1 of the present invention and the control unit 7 that controls the semiconductor device part 21 included in the power unit 2, so that the radiation noise can be further reduced more than ever before.

Embodiment 2

Next, Embodiment 2 of the present invention will be described. FIG. 7 is a diagram schematically illustrating a three-dimensional configuration of the power unit 2 according to Embodiment 2 of the present invention. As shown in FIG. 7, in the power unit 2 according to Embodiment 2 of the present invention, the output-side conductor unit 23 is installed so as to be in contact with the upper face 48 of the capacitor installation part 24.

As the output-side conductor unit 23 is installed so as to be in contact with the upper face 48 of capacitor installation part 24, the positions of first output terminal 27, second output terminal 28, and third output terminal 29 provided in the semiconductor device part 21 differs from those in Embodiment 1. The configuration other than the above is the same as that in Embodiment 1 and descriptions thereof will be omitted.

Figure 7A:
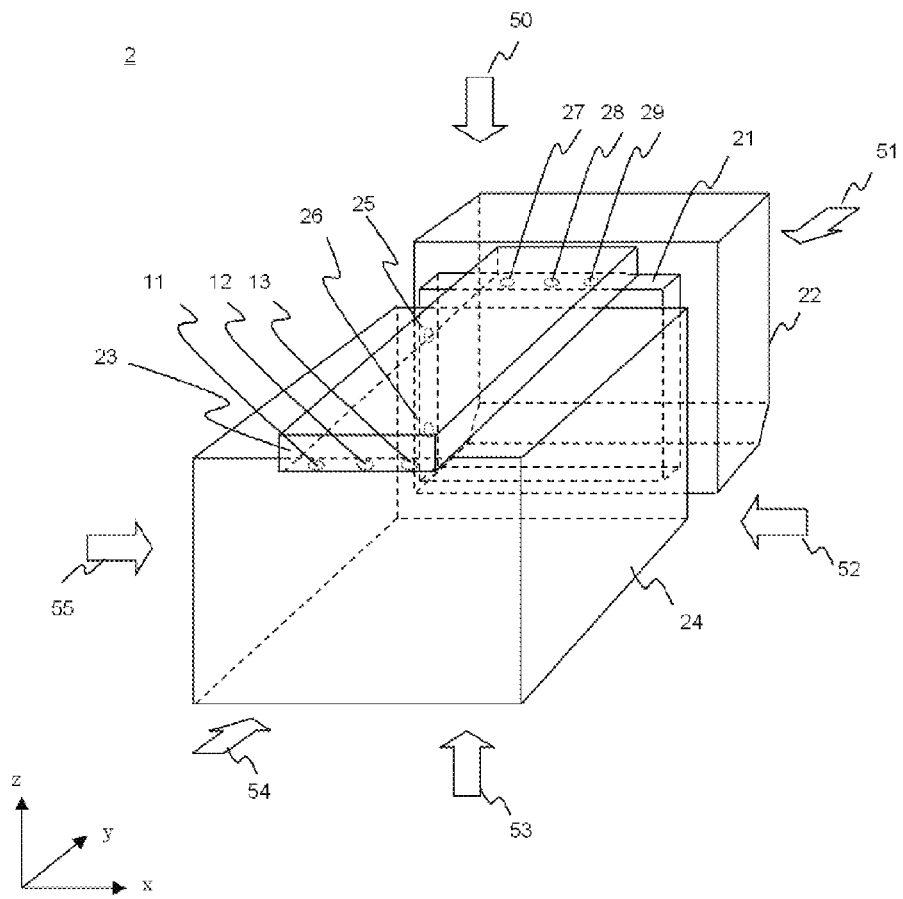
FIG. 7A shows a three-dimensional configuration of a power unit according to Embodiment 2 of the present invention.
Figure 7B:
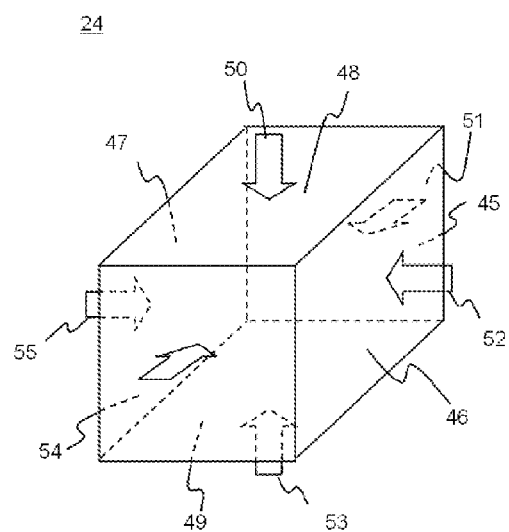
FIG. 7B shows a diagram to explain faces surrounding the capacitor installation part according to Embodiment 2 of the present invention.

Note that, in FIG. 7B, as has already been shown in FIG. 2, the arrow 50 is defined to indicate a direction to which the power unit 2 and the capacitor installation part 24 are viewed downwardly from above. Further, the arrow 53 indicates a direction to which the power unit 2 and the capacitor installation part 24 are viewed upwardly from below. In addition, the arrow 52 indicates a direction vertical to the second face 46 from the outer side with respect to the power unit 2 and the capacitor installation part 24.

Furthermore, the arrow 55 indicates a direction vertical to the third face from the outer side with respect to the power unit 2 and the capacitor installation part 24. The arrow 51 indicates a direction vertical to the first face from the outer side with respect to the power unit 2 and the capacitor installation part 24. In addition, the arrow 54 indicates a direction vertical to the opposite face to the first face of the capacitor installation part 24, from the outer side with respect to the power unit 2 and the capacitor installation part 24.

As shown in FIG. 7A, the output-side conductor unit 23 is installed so as to be in contact with the upper face 48 of capacitor installation part 24 and the semiconductor device part 21. One end portion of the output-side conductor unit 23 is electrically connected to the first output terminal 27, the second output terminal 28, and the third output terminal 29 that are provided in the semiconductor device part 21.

In FIG. 8, the power unit 2 is shown in which a configuration thereof is made clear in terms of the first output-side conductor bar 16, the second output-side conductor bar 17, the third output-side conductor bar 18, the first core 6 in the output-side conductor unit 23, and the capacitor installation part 24 that are shown in FIG. 7. Note that, FIG. 8A to FIG. 8F are figures viewed from the directions of arrow 50 to arrow 55 shown in FIG. 7.

Figure 8A:
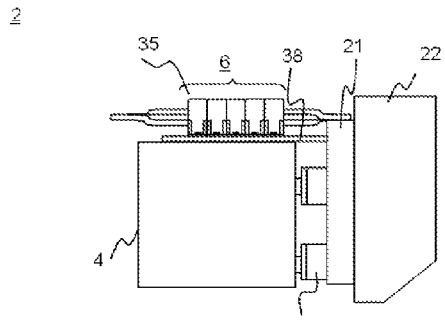
FIG. 8A is a six-sided view showing the detail of power unit according to Embodiment 2 of the present invention.
Figure 8D:
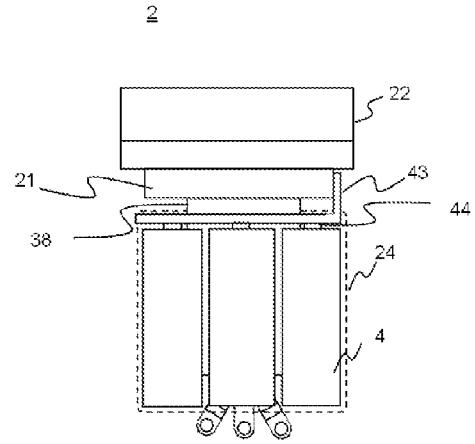
FIG. 8D is a six-sided view showing the detail of power unit according to Embodiment 2 of the present invention.
Figure 8B:
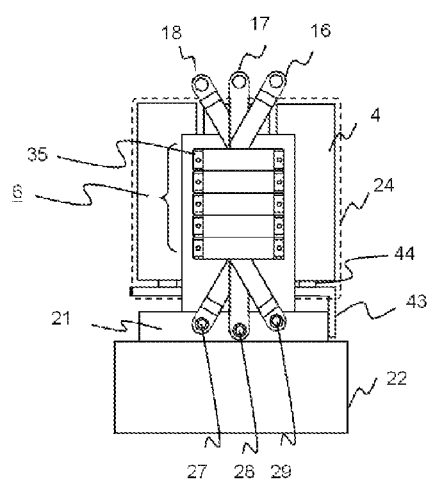
FIG. 8B is a six-sided view showing the detail of power unit according to Embodiment 2 of the present invention.
Figure 8E:
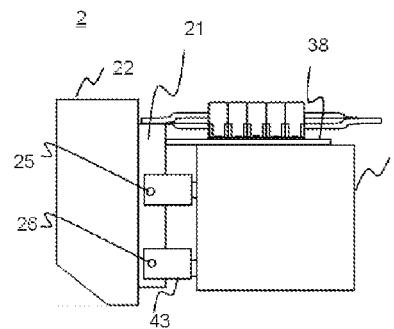
FIG. 8E is a six-sided view showing the detail of power unit according to Embodiment 2 of the present invention.
Figure 8C:
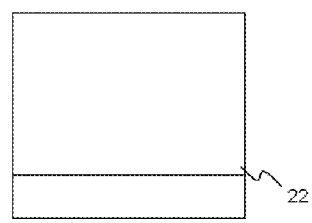
FIG. 8C is a six-sided view showing the detail of power unit according to Embodiment 2 of the present invention.
Figure 8F:
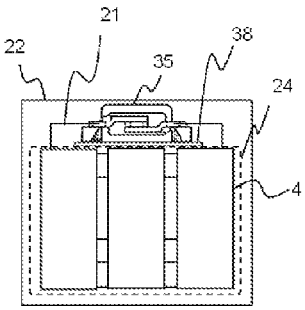
FIG. 8F is a six-sided view showing the detail of power unit according to Embodiment 2 of the present invention.

That is, FIG. 8A is a diagram showing the power unit 2 viewed from the direction of arrow 52 shown in FIG. 7. FIG. 8B is a diagram showing the power unit 2 viewed from the direction of arrow 50 shown in FIG. 7. FIG. 8C is a diagram showing the power unit 2 viewed from the direction of arrow 51 shown in FIG. 7. FIG. 8D is a diagram showing the power unit 2 viewed from the direction of arrow 53 shown in FIG. 7. FIG. 8E is a diagram showing the power unit 2 viewed from the direction of arrow 55 shown in FIG. 7. FIG. 8F is a diagram showing the power unit 2 viewed from the direction of arrow 54 shown in FIG. 7.

As shown in FIG. 8, the fixing plate 38 having flat-plate structure is provided between the first core 6 and the upper face 48 of capacitor installation part 24. The fixing plate 38 is provided so as for the one side thereof to be fixed to the semiconductor device part 21, and the plurality of cores 35 are fixed on the fixing plate 38. Note that, the first core 6 may be constituted by one member.

The fixing plate 38 can be held from below by the upper face 48 of capacitor installation part 24, and thus the output-side conductor unit 23 is more stable than that in Embodiment 1. The configuration other than the above is the same as that described using FIG. 6 and descriptions thereof will be omitted.

In the power unit 2 according to Embodiment 2 of the present invention, the capacitor installation part 24 in which the capacitors 4 are installed, includes the first face 45 in contact with the semiconductor device part 21, and includes the upper face 48 and the lower face 49 that are adjacent to the first face 45 and parallel to the horizontal plane. The first core 6, the first output-side conductor bar 16, the second output-side conductor bar 17, and the third output-side conductor bar 18 are disposed on the upper face 48, so that the output-side conductor unit 23 can be stably fixed. Even when vibration is applied to the power unit 2, the output-side conductor unit 23 can be more stably fixed.

In addition, the power conversion apparatus 1 according to Embodiment 2 of the present invention includes the power unit 2 according to a variation in Embodiment 2 of the present invention and the control unit 7 that controls the semiconductor device part 21 included in the power unit 2, so that the output-side conductor unit 23 can be more stably fixed even when vibration is applied to the power unit 2.

Embodiment 3

FIG. 9 is a diagram schematically illustrating a power unit and a power conversion apparatus including the power unit according to Embodiment 3 of the present invention. As shown in FIG. 9, in the power conversion apparatus 1 according to Embodiment 3, the configuration inside power unit 2 between the terminals 9, 10 on the input side of power unit 2 and the capacitor 4a differs from that in Embodiments 1 and 2.

That is, the power unit 2 according to Embodiment 3 includes an input-side conductor unit 62 between the terminals 9, 10 on the input side of power unit 2 and the capacitor 4a. Further, the input-side conductor unit 62 includes the first input-side conductor bar 19, the second input-side conductor bar 20, and a second core 60.

In addition, a second bundle portion 61 in which the first input-side conductor bar 19 and the second input-side conductor bar 20 are combined, passes through a second penetrating opening 34 of the second core 60. The configuration other than the above is the same as that in Embodiments 1 and 2, and descriptions thereof will be omitted.

Figure 10A:
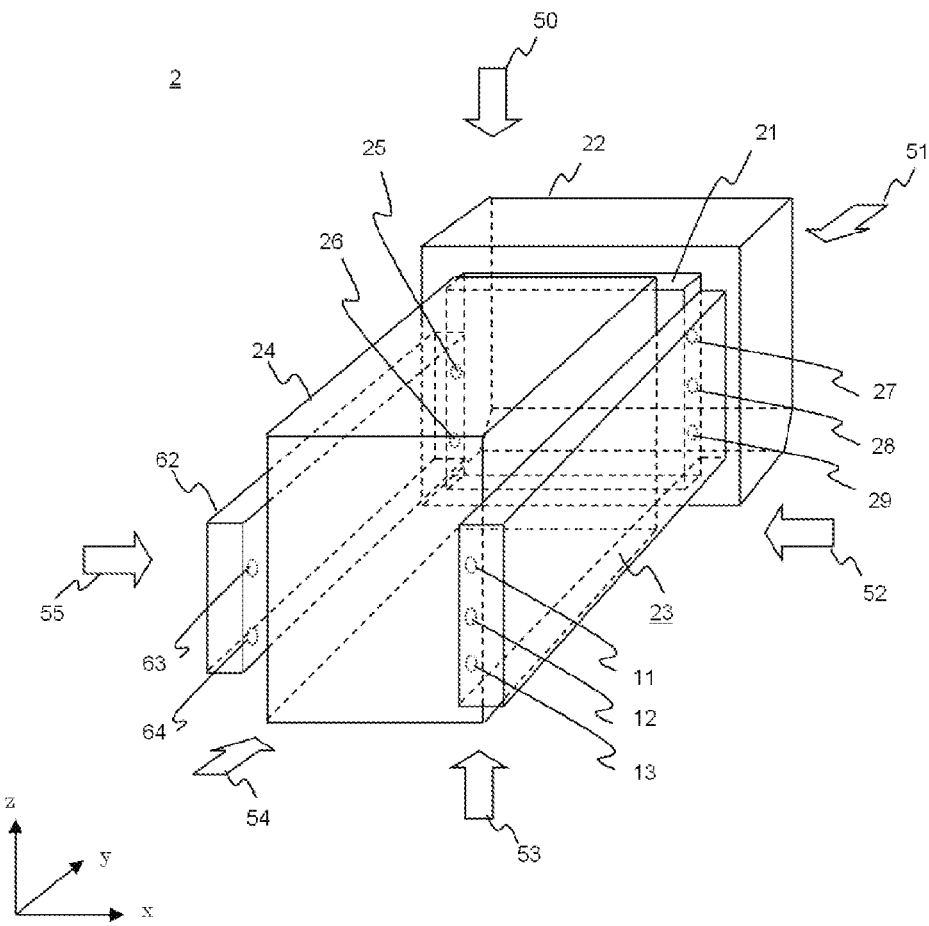
FIG. 10A shows a three-dimensional configuration of the power unit according to Embodiment 3 of the present invention.
Figure 10B:
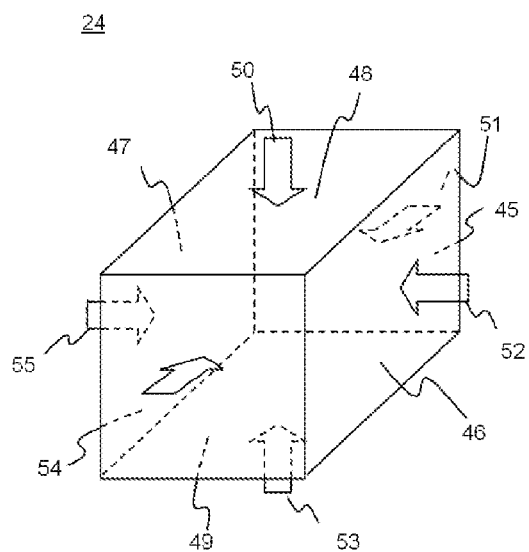
FIG. 10B shows a diagram to explain faces surrounding the capacitor installation part according to Embodiment 3 of the present invention.

FIG. 10 is a diagram schematically illustrating a three-dimensional configuration of the power unit 2 according to Embodiment 3 of the present invention. As shown in FIG. 10B, the capacitor installation part 24 includes the first face 45, the second face 46, the third face 47, the upper face 48, and the lower face 49. The definitions of faces surrounding the capacitor installation part 24 have already been described and descriptions thereof will be omitted.

As shown in FIG. 10A, the input-side conductor unit 62 is installed so as to be in contact with the third face 47 of capacitor installation part 24 and the semiconductor device part 21. One end portion of the input-side conductor unit 62 is electrically connected to the first input terminal 25 and the second input terminal 26 provided in the semiconductor device part 21.

Within the end portions of input-side conductor unit 62, terminals 63 and 64 are provided at the end portion opposite to the end portion that is connected to the semiconductor device part 21. When the power unit 2 is installed inside the power conversion apparatus 1, the power unit 2 is connected to the power conversion apparatus 1 via the terminals 63 and 64.

Figure 11A:
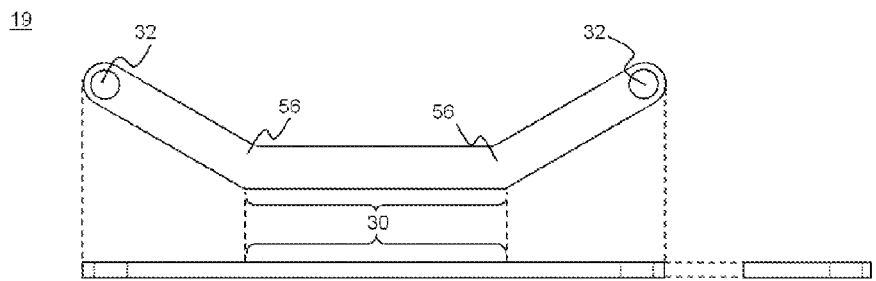
FIG. 11A shows three-sided views of the first input-side conductor bar shapes of first and second output-side conductor bars according to Embodiment 3 of the present invention.
Figure 11B:
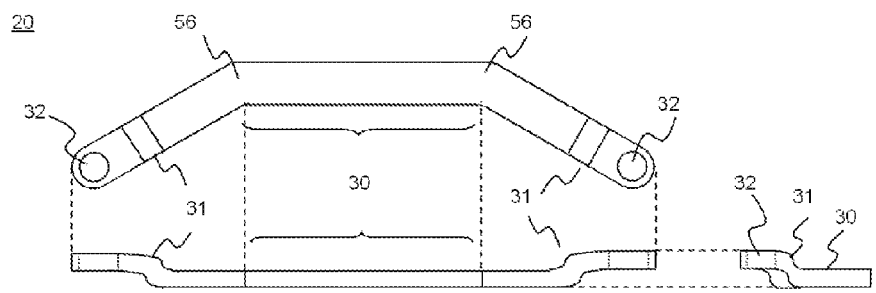
FIG. 11B shows three-sided views of the second input-side conductor bar according to Embodiment 3 of the present invention.

Next, the input-side conductor unit 62 will be described in detail. FIG. 11 shows the shapes of first input-side conductor bar 19 and second input-side conductor bar 20. FIGS. 11A and 11B are respective three-sided views shown for the input-side conductor bar 19 and the second input-side conductor bar 20.

As shown in FIG. 11A, the first input-side conductor bar 19 is a plate conductor having a uniform thickness. At the two bent portions 56, the first input-side conductor bar 19 is bent in a same direction at a preset angle. Further, the first output-side conductor bar 16 has the terminal connection holes 32 at both end portions, and is connected to the first input terminal 25 provided in the semiconductor device part 21. Furthermore, as shown in FIG. 11A, the extended portion 30 being linear is provided between the two bent portions 56.

As shown in FIG. 11B, the second input-side conductor bar 20 is a plate conductor having a uniform thickness. At the two bent portions 56, the second input-side conductor bar 20 is bent in a same direction at a preset angle. Further, as shown in FIG. 11B, the extended portion 30 being linear is provided between the two bent portions 56. Furthermore, the first output-side conductor bar 16 has the terminal connection holes 32 at both end portions, and is connected to the second input terminal 26 provided in the semiconductor device part 21.

In the second input-side conductor bar 20, step portions 31 are provided between the bent portion 56 and the terminal connection hole 32, and at the step portion 31 as a boundary, the position of a plane including the extended portion 30 differs from the position of a plane including the both end portions of the first input-side conductor bar 20, with respect to the thicknesswise direction of second input-side conductor bar 20. The lower illustration in FIG. 11(b) shows that the extended portion 30 is at a lower position than the position of both end portions of the first input-side conductor bar 19.

The shape of second input-side conductor bar 20 is the same as that of the third output-side conductor bar 18 according to Embodiment 1 described using FIG. 3 (hereinafter, if necessary, the first input-side conductor bar 19 and the second input-side conductor bar 20 are collectively called the input-side conductor bars).

Next, an explanation on the placement of first input-side conductor bar 19, second input-side conductor bar 20, and split core 35 in the input-side conductor unit 62 will be given. Note that, the shape of split core 35 has already been shown in FIG. 4 and descriptions thereof will be omitted.

Using a three-sided view, FIG. 12 shows the placement of the first input-side conductor bar 19, the second input-side conductor bar 20, and the second core 60 in the input-side conductor unit 62. The second core 60 is constituted by the plurality of split cores 35.

It is assumed that, similar to the output-side conductor bars, surfaces of the input-side conductor bars except for the terminal connection holes 32 are covered with insulation film (not shown) in order to ensure insulation properties of the input-side conductor bars with each other.

Figure 12A:
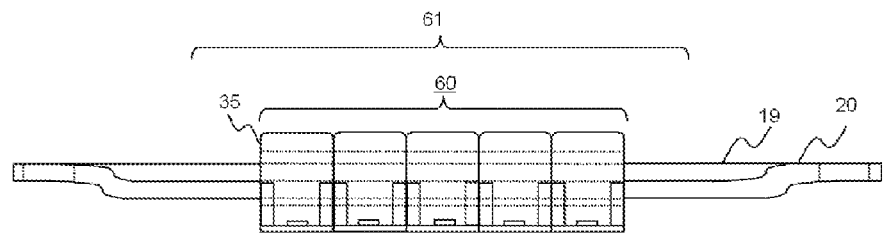
FIG. 12A shows front view installation positions of the first and second output-side conductor bars and the split cores in an output-side conductor unit according to Embodiment 3 of the present invention.
Figure 12B:
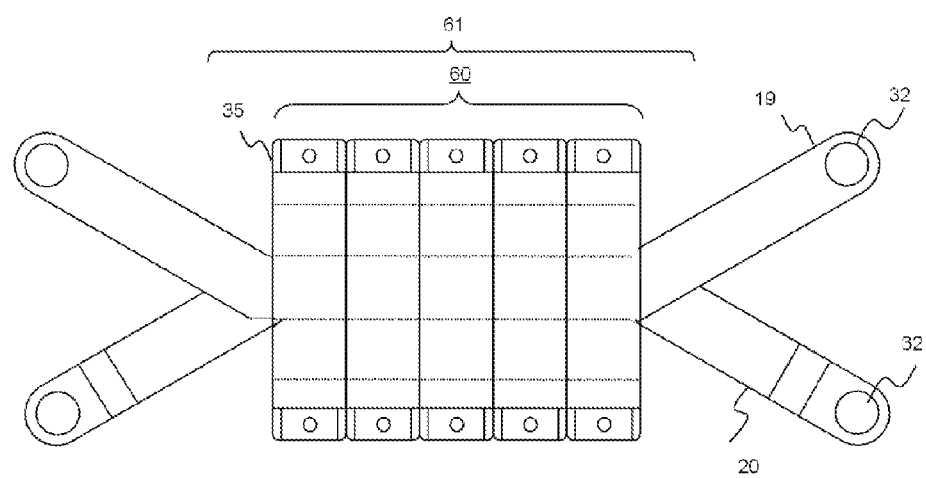
FIG. 12B shows plan view installation positions of the first and second output-side conductor bars and the split cores in an output-side conductor unit according to Embodiment 3 of the present invention.

As shown in FIG. 12B, mutual distance between the first input-side conductor bar 19 and the second input-side conductor bar 20 becomes smaller from the terminal connection holes 32 provided at each end portion toward the center of extended portion. A portion in contact with the first input-side conductor bar 19 and the second input-side conductor bar 20 except for the terminal connection holes 32 is defined as the second bundle portion 61.

Figure 12C:
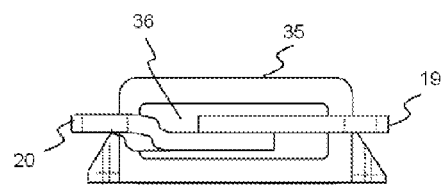
FIG. 12C shows side view installation positions of the first and second output-side conductor bars and the split cores in an output-side conductor unit according to Embodiment 3 of the present invention.

Further, as shown in FIG. 12A and FIG. 12C, the first input-side conductor bar 19 and the second input-side conductor bar 20 are disposed so as to be in contact with each other at the extended portion 30. In addition, since the second output-side bar 20 includes the step portion 31, the terminal connection holes 32 included in the input-side conductor bars are all positioned at the same level. Positioning the terminal connection holes 32 at the same level enables structure for connecting the output-side conductor bars to be simple. Note that, it is natural that, in a case without the step portions 31, a terminal block and connection bars that are connected to the output-side conductor bars may be provided with step portions for the connection, and thus the descriptions are omitted.

The second bundle portion 61 is disposed so as to pass through the penetrating opening 36 of split core 35, and the second core 60 is formed by placing the plurality of split cores 35 side by side in the extending direction of the first input-side conductor bar 19 and the second input-side conductor bar 20.

The second core 60 is constituted by the split cores 35, and thereby the length of second core 60 is properly adjustable, for example, in accordance with the length of extended portion 30 in the extending direction with respect to the first input-side conductor bar 19 and the second input-side conductor bar 20.

In FIG. 13, the power unit 2 is shown in which a configuration thereof is made clear in terms of the first input-side conductor bar 19, the second input-side conductor bar 20, the second core 60 in the input-side conductor unit 62, and the capacitor installation part 24 that are shown in FIG. 10. Note that, FIG. 13A to FIG. 13F are figures viewed from the directions of arrow 50 to arrow 55 shown in FIG. 10.

Figure 13A:
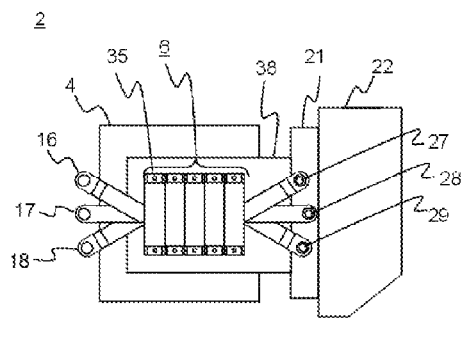
FIG. 13A is a six-sided view showing the detail of power unit according to Embodiment 3 of the present invention.
Figure 13D:
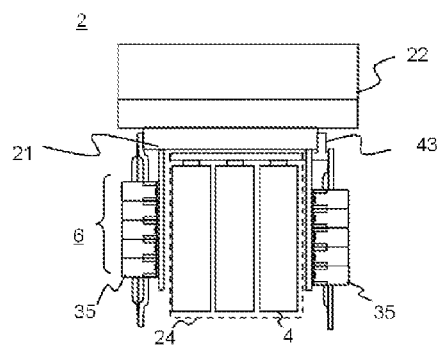
FIG. 13D is a six-sided view showing the detail of power unit according to Embodiment 3 of the present invention.
Figure 13B:
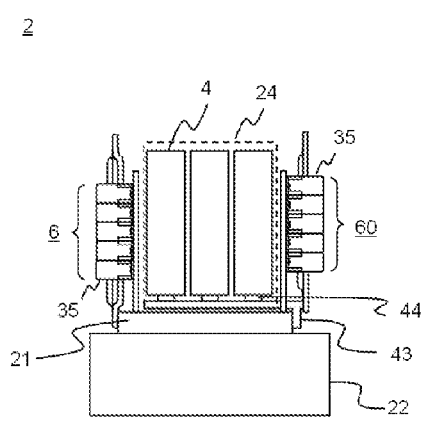
FIG. 13B is a six-sided view showing the detail of power unit according to Embodiment 3 of the present invention.
Figure 13E:
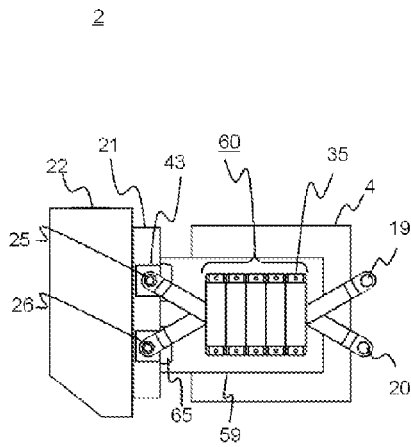
FIG. 13E is a six-sided view showing the detail of power unit according to Embodiment 3 of the present invention.
Figure 13C:
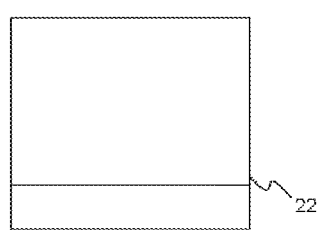
FIG. 13C is a six-sided view showing the detail of power unit according to Embodiment 3 of the present invention.
Figure 13F:
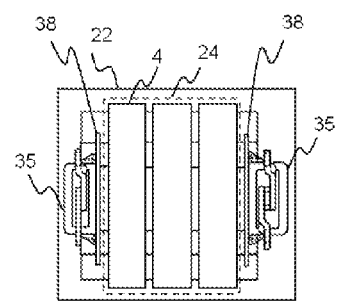
FIG. 13F is a six-sided view showing the detail of power unit according to Embodiment 3 of the present invention.

That is, FIG. 13A is a diagram showing the power unit 2 viewed from the direction of arrow 52 shown in FIG. 10. FIG. 13B is a diagram showing the power unit 2 viewed from the direction of arrow 50 shown in FIG. 10. FIG. 13C is a diagram showing the power unit 2 viewed from the direction of arrow 51 shown in FIG. 10. FIG. 13D is a diagram showing the power unit 2 viewed from the direction of arrow 53 shown in FIG. 10. FIG. 13E is a diagram showing the power unit 2 viewed from the direction of arrow 55 shown in FIG. 10. FIG. 13F is a diagram showing the power unit 2 viewed from the direction of arrow 54 shown in FIG. 10.

As shown in FIG. 13, a perforated fixing plate 59 having flat-plate structure is provided between the input-side conductor unit 62 and the third face 47 of capacitor installation part 24 so as for the one side thereof to be fixed to the semiconductor device part 21. The plurality of cores 35 included in the input-side conductor unit 62 are fixed on the perforated fixing plate 59.

In addition, the perforated fixing plate 59 includes through-holes 65 for capacitor connection conductors 43, and the capacitor connection conductors 43 penetrate the through-holes 65 for capacitor connection conductors 43, so that the capacitor connection terminals 44 are connected to the first input terminal 25 and the second input terminal 26.

Note that, the embodiment is described in FIG. 13 in which the perforated fixing plate 59 has flat-plate structure. However, it is not limited to the plate and may have any structure as long as the split core 35 can be fixed. For example, a method may be employed in which a bar plate is provided at positions corresponding to the core fixing protrusion portions 42 and a part of the bar plate is fixed to the semiconductor device part 21, the cooling fin 22, or the capacitor 4. By properly changing the structure of perforated fixing plate 59, weight reduction of the power unit 2 can be realized.

The power unit 2 according to Embodiment 3 of the present invention includes: the first input-side conductor bar 19 and the second input-side conductor bar 20 that are included in the power unit and connected to the first input terminal 25 and the second input terminal 26, respectively; and the second core 60 through which the first input-side conductor bar 19 and the second input-side conductor bar 20 penetrate and that is included in the power unit 2. Therefore, the radiation noise can be further reduced.

Further, in the power unit 2 according to Embodiment 3 of the present invention, the second bundle portion 61 is included in which the first input-side conductor bar 19 and the second input-side conductor bar 20 are combined, and the second bundle portion 61 penetrates the second core 60, so that the space inside the power unit 2 can be effectively utilized.

In addition, the power conversion apparatus 1 according to Embodiment 3 of the present invention includes the power unit 2 according to Embodiment 3 of the present invention and the control unit that controls the semiconductor device part 21 included in the power unit 2, so that the radiation noise can be further reduced.

Embodiment 4

Figure 14A:
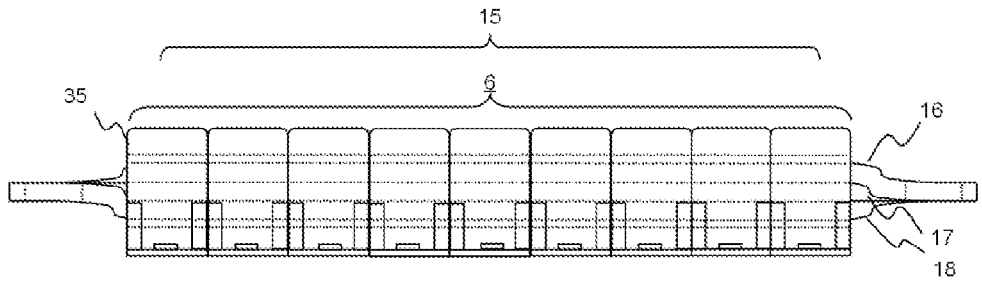
FIG. 14A shows front view installation positions of a first to a third output-side conductor bars and split cores in an output-side conductor unit according to Embodiment 4 of the present invention.
Figure 14B:
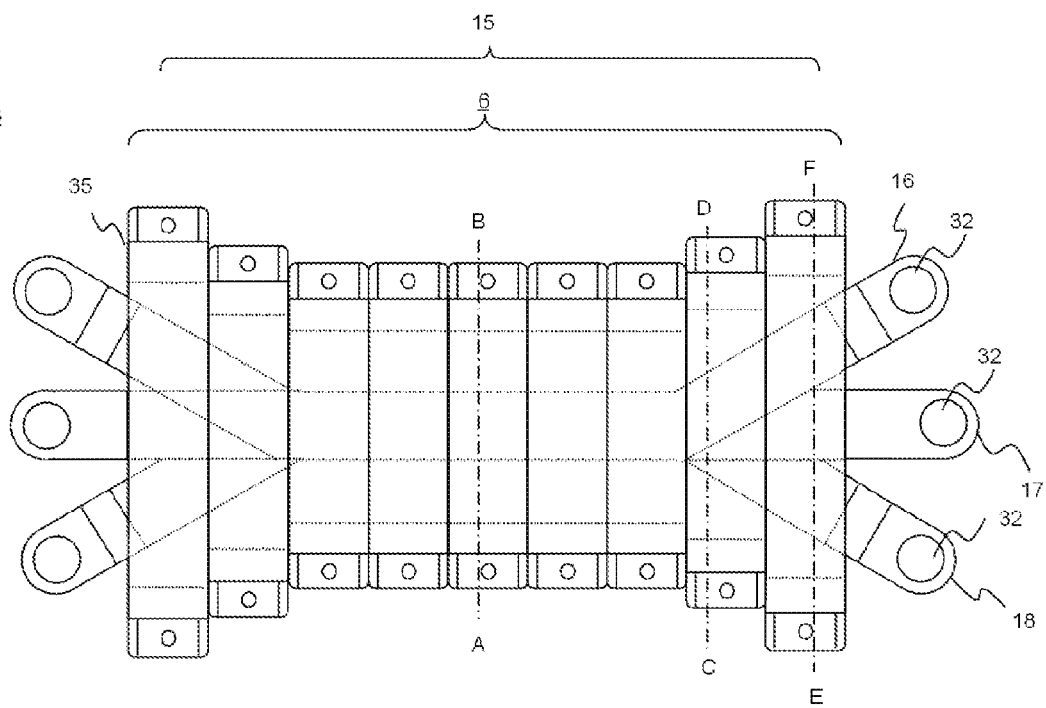
FIG. 14B shows plan view installation positions of a first to a third output-side conductor bars and split cores in an output-side conductor unit according to Embodiment 4 of the present invention.
Figure 14C:
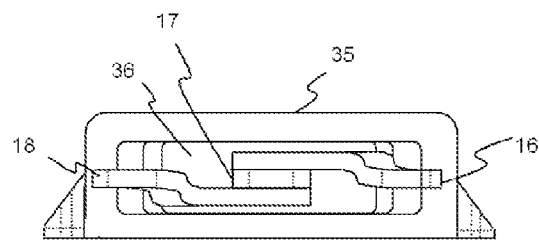
FIG. 14C shows side view installation positions of a first to a third output-side conductor bars and split cores in an output-side conductor unit according to Embodiment 4 of the present invention.

FIG. 14 shows a three-sided view of the output-side conductor unit 23 according to Embodiment 4 of the present invention. FIG. 14A, FIG. 14B, and FIG. 14C show a front view, a plan view, and a side view of the output-side conductor unit 23 according to Embodiment 4 of the present invention, respectively. In the split cores 35 included in the output-side conductor unit 23 according to Embodiment 4 of the present invention, the size of penetrating opening 36 is different in accordance with a cross-sectional area of the output-side conductor bar that passes through the penetrating opening 36.

Note that, the cross-sectional area of output-side conductor bar is defined as a total cross-sectional area of the first output-side conductor bar 16, the second output-side conductor bar 17, and the second output-side conductor bar 18, with respect to the vertical plane to the extending direction of output-side conductor bars. The configuration other than the above is the same as that in Embodiments 1 to 3, and descriptions thereof will be omitted.

As shown in FIG. 14B, the penetrating opening 36 in the split core 35 that is placed substantially at the center of second bundle portion 61 in the extending direction becomes larger as approaching the terminal connection holes 32 in the first output-side conductor bar 16, the second output-side conductor bar 17, and the third output-side conductor bar 18.

Here, consider the cross sections of output-side conductor unit 23 with respect to the lines AB, CD, and EF shown by dashed-dotted lines in FIG. 14(b). Note that, the lines AB, CD, and EF are included in the planes vertical to the extending direction of output-side conductor bars.

Figure 15A:
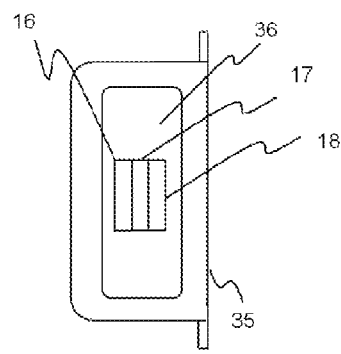
FIG. 15A shows a cross section in the output-side conductor unit according to Embodiment 4 of the present invention.
Figure 15B:
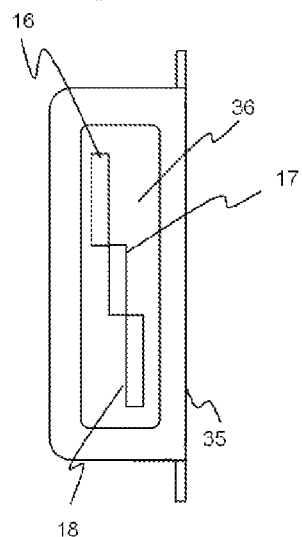
FIG. 15B shows a cross section in the output-side conductor unit according to Embodiment 4 of the present invention.

FIG. 15 shows the cross sections of output-side conductor unit 23 with respect to the lines shown by the dashed-dotted lines in FIG. 14B. FIG. 15A shows the cross section of output-side conductor unit 23 with respect to the line AB in FIG. 14. FIG. 15B shows the cross section of output-side conductor unit 23 with respect to the line CD in FIG. 14.

Figure 15C:
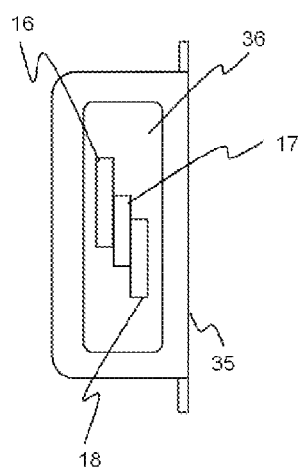
FIG. 15C shows a cross section in the output-side conductor unit according to Embodiment 4 of the present invention.

FIG. 15C shows the cross section of output-side conductor unit 23 with respect to the line EF in FIG. 14.

As shown in FIG. 15, although the cross section of second output-side conductor bar 17 is the same in FIG. 15A to FIG. 15C, in the cross section with respect to the line BC shown in FIG. 15B, the cross-sectional area of first output-side conductor bar 16 or third output-side conductor bar 18 is increased compared to that of the cross section with respect to the line AB shown in FIG. 15A.

Further, in the cross section with respect to the line EF shown in FIG. 15C, the cross-sectional area of first output-side conductor bar 16 or third output-side conductor bar 18 is further increased compared to that of the cross section with respect to the line BC shown in FIG. 15B.

That is, a total cross-sectional area of the first output-side conductor bar 16, the second output-side conductor bar 17, and the third output-side conductor bar 18 that pass through the penetrating opening 36 increases as approaching the terminal connection holes 32 from the center of extending portion 30.

In accordance with the cross-sectional area of output-side conductor bar, the size of penetrating opening 36 is changed. Note that, in Embodiment 4 of the present invention, an example is given in which the split core having a different size in the penetrating opening 36 is used for the output-side conductor unit 23, this may be applied to the input-side conductor unit 62.

In the power unit 2 according to Embodiment 4 of the present invention, the penetrating opening 36 in the plurality of split cores 35 has a size in accordance with the cross-sectional areas of first output-side conductor bar 16, second output-side conductor bar 17, and third output-side conductor bar 18 that pass through the penetrating opening 36, with respect to the planes vertical to the extending direction of first output-side conductor bar 16, second output-side conductor bar 17, and third output-side conductor bar 18, so that the radiation noise can be further reduced.

In addition, the power conversion apparatus 1 according to Embodiment 4 of the present invention includes the power unit 2 according to Embodiment 4 of the present invention and the control unit 7 that controls the semiconductor device part 21 included in the power unit 2, so that the radiation noise can be further reduced.

Embodiment 5

FIG. 16 shows a split core according to Embodiment 5 of the present invention. The configuration other than the above is the same as that in Embodiments 1 to 4, and descriptions thereof will be omitted.

The split core 35 described in Embodiments 1 to 4 is a closed ring or a closed rectangle in shape, having the penetrating opening 36. Thus, when the input-side conductor bar or the output-side conductor bar that has the bent portions is inserted through the penetrating opening 36, the input-side conductor bar or the output-side conductor bar is installed while changing its direction.

Since the plurality of input-side conductor bars or output-side conductor bars are installed by inserting them into the penetrating opening 36 of split core 35 while changing their directions, the penetrating opening 36 needs to have a minimum necessary size to allow the input-side conductor bars or the output-side conductor bars to change their directions.

However, the space between the input-side conductor bars or the output-side conductor bars and the split core 35 where the penetrating opening 36 is formed is a dead space when the power unit is operated, and thus the downsizing of power unit 2 is limited.

Therefore, the split core 35 is separated into a first split core member 66 and a second split core member 67, and thus inserting the conductor bars into the penetrating opening 36 being closed becomes unnecessary, so that the space between the input-side conductor bar or the output-side conductor bar and the split core 35 where the penetrating opening 36 is formed can be smaller than ever before and the power unit 2 can be downsized.

Figure 16A:
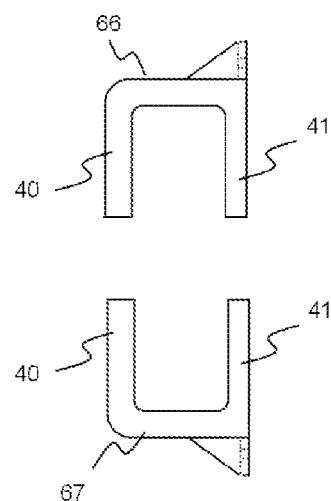
FIG. 16A shows a split core according to Embodiment 5 of the present invention.
Figure 16B:
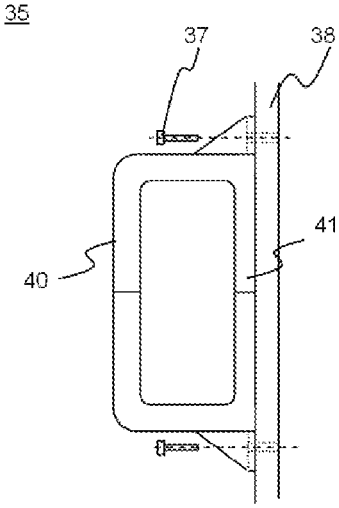
FIG. 16B shows a split core according to Embodiment 5 of the present invention.

FIG. 16A and FIG. 16B show the split core 35 according to Embodiment 5 of the present invention. As shown in FIG. 16A and FIG. 16B, the split core 35 according to Embodiment 4 of the present invention can be separated at two portions of the arch portion 40 and the fixing portion 41. That is, as shown in FIG. 16, the split core 35 includes the first split core member 66 and the second split core member 67.

Figure 17A:
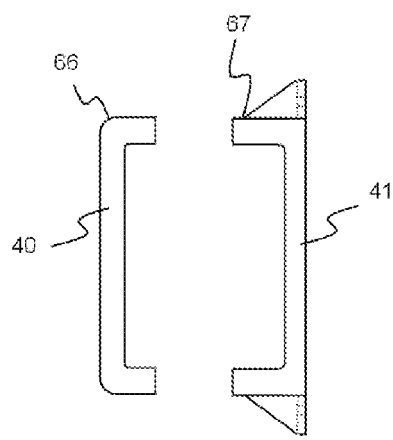
FIG. 17A shows a variation of the split core according to Embodiment 5 of the present invention.
Figure 17B:
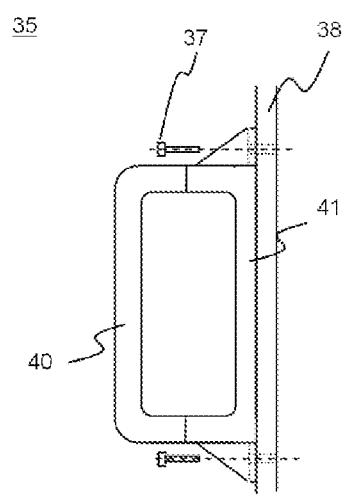
FIG. 17B shows a variation of the split core according to Embodiment 5 of the present invention.

FIG. 17A and FIG. 17B show a variation of the split core 35 according to Embodiment 5 of the present invention. As shown in FIG. 17A and FIG. 17B, the split core 35 can be separated at the centers of the arch portion 40 and the fixing portion 41. In FIG. 17, the first split core member 66 includes the arch portion 40 and the second split core member 67 includes the fixing portion 41.

The first split core member 66 and the second split core member 67 that are shown in FIG. 16A, FIG. 16B, FIG. 17A and FIG. 17B can be adopted in accordance with the installation position of split core 35. The split core 35 shown in FIG. 16 is effective when the input-side conductor unit 62 and the output-side conductor unit 23 are installed on the third and second faces of the capacitor installation part 24.

That is, it is preferable that the second split core member 67 shown in FIG. 16 is fixed in advance on the fixing plate 38 that is installed vertically and the first split core member 66 is fixed after the input-side conductor bar or the output-side conductor bar is installed.

Meanwhile, the split core 35 shown in FIG. 17 is effective when the output-side conductor unit 23 is installed on the upper face of capacitor installation part 24. That is, it is preferable that the second split core member 67 shown in FIG. 17 is fixed in advance on the fixing plate 38 that is installed horizontally and the first split core member 66 is fixed after the input-side conductor bar or the output-side conductor bar is installed.

As a method used for joining the first split core member 66 to the second split core member 67, a method can be used in which threaded screw holes are provided in the first split core member 66 and the second split core member 67, and screws are inserted into the threaded screw holes to fix them. Further, a ring fixing member may be placed along the outer periphery of split core 35 and clamp the first split core member 66 and the second split core member 67 to join them.

In the power unit 2 according to Embodiment 5 of the present invention, the split core 35 is constituted by the first split core member 66 and the second split core member 67 that are provided to be separable, so that the power unit 2 can be further downsized.

In addition, the power conversion apparatus 1 according to Embodiment 5 of the present invention includes the power unit 2 according to Embodiment 5 of the present invention and the control unit 7 that controls the semiconductor device part 21 included in the power unit 2, so that the power conversion apparatus 1 can be further downsized.

Embodiment 6

Figure 18:
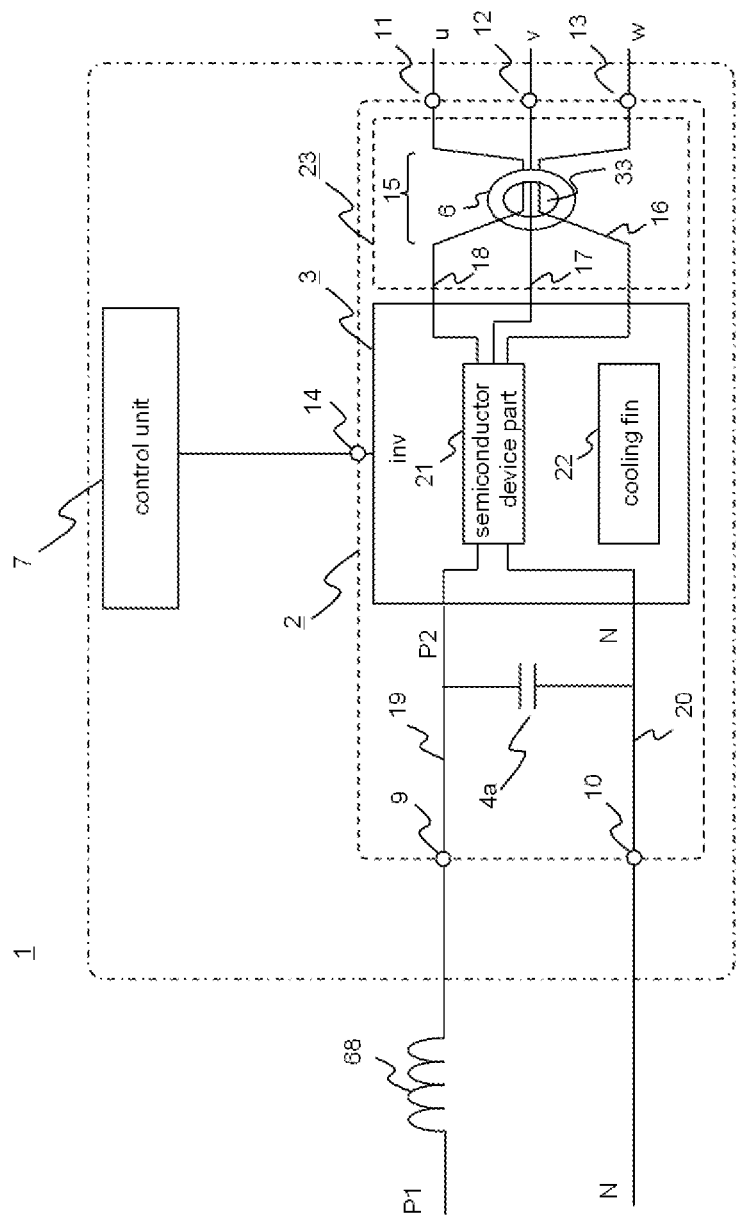
FIG. 18 is a diagram schematically illustrating a power unit and a power conversion apparatus including the power unit according to Embodiment 6 of the present invention.

FIG. 18 schematically shows a power unit and a power conversion apparatus including the power unit according to Embodiment 6 of the present invention. In Embodiments 1 to 5, the configurations are such that the converter 5 is provided between the inverter 3 and the power source supplying AC power, the converter 5 converts AC power inputted to the power conversion apparatus into DC power, and then the DC power is inputted to the power unit 2.

Embodiment 6 of the present invention relates to a power conversion apparatus in a case where DC power is supplied from a DC aerial line. As shown in FIG. 18, a reactor 68 is connected, outside the power conversion apparatus 1, to the P1 line of the capacitor 4a that is connected in parallel to the input side of inverter 3. The configuration other than the above is the same as that in Embodiment 1, so that descriptions thereof will be omitted.

In the power conversion apparatus 1 according to Embodiment 6 of the present invention, harmonic components in the DC power inputted to the power conversion apparatus 1 can be suppressed by installing the reactor 68, so that the radiation noise can be further reduced. Note that, the power conversion apparatus in which the DC power is supplied from the DC aerial line includes a power converter such as a railway vehicle power converter.

In addition, since the power conversion apparatus 1 according to Embodiment 6 of the present invention includes the power unit 2 according to Embodiment 6 of the present invention and the control unit 7 that controls the semiconductor device part 21 included in the power unit 2, the power conversion apparatus can be realized in which the radiation noise is further reduced.

The present invention is not limited to the above described embodiments, and within the scope of the invention, each embodiment can be freely combined, or each embodiment can properly be modified or omitted.

EXPLANATION OF REFERENCE CHARACTERS 1 power conversion apparatus
2 power unit
3 inverter
4 capacitor
6 first core
7 control unit
15 first bundle portion
16 first output-side conductor bar
17 second output-side conductor bar
18 third output-side conductor bar
19 first input-side conductor bar
20 second input-side conductor bar
21 semiconductor device part
24 capacitor installation part
25 first input terminal
26 second input terminal
27 first output terminal
28 second output terminal
29 third output terminal
35 split core
36 penetrating opening
45 first face
46 second face
47 third face
48 upper face
49 lower face
60 second core
61 second bundle portion
66 first split core member
67 second split core member

The invention claimed is:

1. A power unit that can be attached to and detached from a power conversion apparatus, comprising:
a semiconductor device part that is provided with a first input terminal, a second input terminal, a first output terminal, a second output terminal, and a third output terminal, and that converts electric power inputted to the first input terminal and the second input terminal to output the converted electric power to the first output terminal, the second output terminal, and the third output terminal;
a capacitor that is connected in parallel to the semiconductor device part via the first input terminal and the second input terminal;
a first output-side conductor bar, a second output-side conductor bar, and a third output-side conductor bar that are respectively connected to the first output terminal, the second output terminal, and the third output terminal, and included inside the power unit; and
a first core through which the first output-side conductor bar, the second output-side conductor bar, and the third output-side conductor bar pass, and that is included inside the power unit, wherein
when the power unit is viewed from a side of a cooling fin that is disposed in a side of the semiconductor device part different from a side in which the capacitor is disposed, and that dissipates heat generated from the semiconductor device part, the semiconductor device part, the capacitor, the first output-side conductor bar, the second output-side conductor bar, the third output-side conductor bar, and the first core are placed only inside an area occupied by the cooling fin.

2. The power unit according to claim 1, wherein
the first output-side conductor bar and the third output-side conductor bar each include an extended portion, and bent portions provided at both ends of the extended portion; and
the first output-side conductor bar, the second output-side conductor bar, and the third output-side conductor bar include a first bundle portion which passes through the first core; and
the first bundle portion includes the extended portion of the first output-side conductor bar and the extended portion of the third output-side conductor bar.

3. The power unit according to claim 1, wherein respective both end portions of the first output-side conductor bar, the second output-side conductor bar, and the third output-side conductor bar are positioned in a same plane on each side of the end portions.

4. The power unit according to claim 1, wherein
a capacitor installation part in which the capacitor is installed includes a first face in contact with the semiconductor device part, and a second face and a third face that are adjacent to the first face and vertical to a horizontal plane; and
the first core, the first output-side conductor bar, the second output-side conductor bar, and the third output-side conductor bar are disposed in the second face.

5. The power unit according to claim 4, further comprising a fixing plate that is disposed on a side of the second face of the capacitor installation part and fixed to the semiconductor device part, wherein the first core is fixed to the fixing plate.

6. The power unit according to claim 1, wherein
a capacitor installation part in which the capacitor is installed includes a first face in contact with the semiconductor device part, and an upper face and a lower face that are adjacent to the first face and parallel to a horizontal plane; and
the first core, the first output-side conductor bar, the second output-side conductor bar, and the third output-side conductor bar are disposed in the upper face.

7. The power unit according to claim 6, further comprising a fixing plate that is disposed on a side of the upper face of the capacitor installation part and fixed to the semiconductor device part, wherein the first core is fixed to the fixing plate.

8. The power unit according to claim 1, further comprising:
a first input-side conductor bar and a second input-side conductor bar that are respectively connected to the first input terminal and the second input terminal, and included inside the power unit; and
a second core through which the first input-side conductor bar and the second input-side conductor bar pass, and that is included inside the power unit.

9. The power unit according to claim 8, wherein
the first input-side conductor bar includes an extended portion, and bent portions provided at both ends of the extended portion; and
the first input-side conductor bar and the second input-side conductor bar which passes through the second core; and
the second bundle portion includes the extended portion of the first input-side conductor bar.

10. The power unit according to claim 8, wherein
respective both end portions of the first input-side conductor bar and the second input-side conductor bar are positioned in a same plane on each side of the end portions.

11. The power unit according to claim 8, wherein
the capacitor installation part in which the capacitor is installed includes a first face in contact with the semiconductor device part, and a second face and a third face that are adjacent to the first face and vertical to a horizontal plane;
a fixing plate that is disposed on a side of the third face of the capacitor installation part and fixed to the semiconductor device part is included;
the second core, the first input-side conductor bar, and the second input-side conductor bar are disposed in the third face; and
the second core is fixed to the fixing plate.

12. The power unit according to claim 1, wherein the first core is formed by disposing a plurality of split cores each of which has a penetrating opening, side by side in an extending direction of the first output-side conductor bar, the second output-side conductor bar, and the third output-side conductor bar.

13. The power unit according to claim 12, wherein the penetrating opening in each of the plurality of split cores is rectangular in shape.

14. The power unit according to claim 12, wherein a size of the penetrating opening in the plurality of split cores is in accordance with a cross-sectional area in the first output-side conductor bar, the second output-side conductor bar, and the third output-side conductor bar in a plane vertical to the extending direction of the first output-side conductor bar, the second output-side conductor bar, and the third output-side conductor bar.

15. The power unit according to claim 12, wherein the split core includes a first split core member and a second split core member that are provided to be separable.

16. A power conversion apparatus comprising:
the power unit according to claim 1; and
a control unit that controls the semiconductor device part included in the power unit.

\* \* \* \* \*